United States Patent
Shimizu et al.

(10) Patent No.: US 8,390,117 B2
(45) Date of Patent: Mar. 5, 2013

(54) SEMICONDUCTOR DEVICE AND METHOD OF MANUFACTURING THE SAME

(75) Inventors: Yoshiaki Shimizu, Shiga (JP); Yuichiro Yamada, Osaka (JP); Toshiyuki Fukuda, Kyoto (JP)

(73) Assignee: Panasonic Corporation, Osaka (JP)

( * ) Notice: Subject to any disclaimer, the term of this patent is extended or adjusted under 35 U.S.C. 154(b) by 638 days.

(21) Appl. No.: 12/331,467

(22) Filed: Dec. 10, 2008

(65) Prior Publication Data

US 2009/0146301 A1 Jun. 11, 2009

(30) Foreign Application Priority Data

Dec. 11, 2007 (JP) .................................. 2007-319033
Dec. 19, 2007 (JP) .................................. 2007-326622

(51) Int. Cl.
*H01L 23/482* (2006.01)
*H01L 23/488* (2006.01)
*H01L 21/44* (2006.01)

(52) U.S. Cl. ......... 257/738; 257/E23.021; 257/E23.012; 257/E21.536

(58) Field of Classification Search .................. 257/738, 257/772, E23.021, E23.012, E21.536
See application file for complete search history.

(56) References Cited

U.S. PATENT DOCUMENTS

| | | | |
|---|---|---|---|
| 5,608,265 A | 3/1997 | Kitano et al. | 257/738 |
| 5,844,315 A | 12/1998 | Melton et al. | 257/738 |
| 6,046,499 A * | 4/2000 | Yano et al. | 257/712 |
| 6,590,291 B2 * | 7/2003 | Akagawa | 257/774 |
| 6,841,875 B2 * | 1/2005 | Ohsumi | 257/738 |
| 6,991,965 B2 * | 1/2006 | Ono | 438/114 |
| 7,723,839 B2 | 5/2010 | Yano et al. | |
| 7,968,990 B2 | 6/2011 | Tanaka et al. | |
| 2001/0026010 A1 | 10/2001 | Horiuchi et al. | 257/678 |
| 2002/0135057 A1 | 9/2002 | Kurita | 257/685 |
| 2004/0253803 A1 * | 12/2004 | Tomono et al. | 438/614 |
| 2005/0121764 A1 * | 6/2005 | Mallik et al. | 257/686 |
| 2006/0148317 A1 | 7/2006 | Akaike et al. | 439/607 |
| 2007/0176317 A1 | 8/2007 | Morita et al. | 264/138 |

FOREIGN PATENT DOCUMENTS

| | | |
|---|---|---|
| JP | 2002-359323 | 12/2002 |
| JP | 2003-174048 | 6/2003 |
| JP | 2003-174124 | 6/2003 |
| JP | 2003-258009 | 9/2003 |
| JP | 2004-327855 | 11/2004 |
| JP | 2006-344917 | 12/2006 |
| WO | WO 2007/083351 A1 | 7/2007 |

* cited by examiner

*Primary Examiner* — Calvin Lee
*Assistant Examiner* — Monica D Harrison
(74) *Attorney, Agent, or Firm* — Steptoe & Johnson LLP

(57) ABSTRACT

A semiconductor device capable of realizing highly reliable three-dimensional mounting, and a method of manufacturing the same, are provided. A projected electrode 9 is formed in a region outside of an element mounting region of a substrate 5. The projected electrode 9 includes a protruding portion that protrudes from the front face of a molding resin portion 10. The distal end of the protruding portion is a flat face 13. In addition, a portion of the projected electrode 9 whose cross section is larger than the protruding portion is positioned inside the molding resin portion 10.

19 Claims, 14 Drawing Sheets

SEMICONDUCTOR DEVICE AND METHOD OF MANUFACTURING THE SAME

FIELD OF THE INVENTION

The present invention relates to a semiconductor device to be used in a semiconductor apparatus with a three-dimensional mounting structure, and a method of manufacturing the semiconductor device.

BACKGROUND OF THE INVENTION

In recent years, Package-on-Package (hereinafter referred to as "PoP") semiconductor apparatuses have been used in mobile phones, digital cameras, mobile personal computers, and the like. As a semiconductor device to be used in a semiconductor apparatus with a three-dimensional mounting structure such as a PoP semiconductor apparatus, various low-profile/small-sized semiconductor devices that allow other semiconductor devices to be stacked on top are being proposed.

A conventional semiconductor device enabling another semiconductor device to be stacked on top includes: a substrate; a semiconductor element mounted on one face (hereinafter referred to as a "front face" or a "substrate front face") of the substrate; a molding resin portion that molds the semiconductor element mounted on the substrate with resin; and a projected electrode formed in a region outside of a resin-molded region of the substrate. As shown, conventionally, the projected electrode for providing electrical connection to another semiconductor device to be stacked is formed in the region outside of the resin-molded region of the substrate. However, when a resin-molded region and a region not molded with resin exist on a substrate, warpage disadvantageously occurs on the substrate. In this light, a technique has been proposed for molding, with resin, the entire front face of a substrate on which a semiconductor element and a projected electrode are disposed.

For example, the following technique is disclosed in Japanese Patent Laid-Open No. 2003-174048. First, a semiconductor element is mounted on one face (front face) of a flexible substrate. Next, a projected electrode that protrudes beyond the semiconductor element is provided and, at the same time, on the other face of the substrate (the face on the opposite side of the front face: hereinafter referred to as a "rear face"), a rear face electrode is formed at apposition corresponding to the formation position of the projected electrode. In this case, a stud rod with a flat distal end-face and a cylindrical body is used as the projected electrode. More specifically, a small diameter portion of the stud rod is inserted into a penetrating hole of the substrate, and a soldering paste is injected into the penetrating hole to form a junction at which conduction is achieved between a wiring pattern and the stud rod. At this point, the rear face electrode is formed using the soldering paste injected into the penetrating hole.

The substrate is then set in a molding mold in which an elastic body such as silicon rubber is disposed in advance on a molding face. By performing compression molding on resin supplied to a front face-side of the substrate, a molding resin portion is formed which molds the semiconductor element and the projected electrode with resin. At this point, the substrate is deformed by the compression force during resin molding so as to cause the rear face electrode to protrude. In addition, an end of the projected electrode is brought into close contact with the elastic body by the compression force during resin molding. Consequently, the end of the projected electrode can be projected from an upper face of the molding resin portion while preventing resin from adhering to the end of the projected electrode during resin molding.

In addition, for example, the following technique is disclosed in Japanese Patent Laid-Open No. 2004-296555. First, a wafer with bumps formed on the principal face of the wafer is set inside upper and lower molds in which a strippable film has been adhered to a molding face. Next, compression molding is performed on a silicone rubber composition for molding or a liquid thermosetting epoxy resin composition supplied to a principal face-side of the wafer. Consequently, since the compression force during resin molding causes ends of the bumps to adhere to the strippable film, the ends of the bumps can be projected from an upper face of a molding resin portion.

Furthermore, for example, the following technique is disclosed in Japanese Patent Laid-Open No. 2004-327855. A description on the technique will now be given with reference to FIG. 31.

First, a projected electrode 103 is formed on a laminated land 102 formed on the front face of a substrate 101. A semiconductor element 104 is then mounted in an element mounting region on the front face of the substrate 101. Next, a connecting terminal 105 formed on the front face of the substrate 101 and an electrode terminal 106 formed on the principal face of the semiconductor element 104 are electrically connected to each other via a thin metallic wire 107. The substrate 101 is then set in a molding mold in which an elastic tape 108 is attached in advance to a molding face (inner face) of the mold. Next, in a state where an end of the projected electrode 103 is embedded into the elastic tape 108, a molding resin portion 109 that molds the semiconductor element 104 and the projected electrode 103 with resin is transfer-molded. The elastic tape 108 attached to an upper face of the molding resin portion 109 of a molded body extracted from the molding mold is then stripped away. Consequently, the end of the projected electrode 103 can be projected from the upper face of the molding resin portion 109. Subsequently, a rear-face projected electrode 111 is formed on a rear-face land 110 formed on the rear face of the substrate 101.

Moreover, for example, the following technique is disclosed in Japanese Patent Laid-Open No. 2002-359323. A description on the technique will now be given with reference to FIG. 32.

First, a projected electrode 203 is formed on a laminated land 202 formed on the front face of a substrate 201. A semiconductor element 204 is then mounted in an element mounting region on the front face of the substrate 201. Next, a connecting terminal 205 formed on the front face of the substrate 201 and an electrode terminal 206 formed on the principal face of the semiconductor element 204 are electrically connected to each other via a thin metallic wire 207. The substrate 201 is then set in a molding mold. Next, a molding resin portion 208 that molds the semiconductor element 204 and the projected electrode 203 with resin is transfer-molded. Next, an upper portion of the molding resin portion 208 of a molded body extracted from the molding mold is cut off. Consequently, a flattened distal end face of the projected electrode 203 can be exposed from an upper face of the molding resin portion 208. Subsequently, a rear-face projected electrode 210 is formed on a rear-face land 209 formed on the rear face of the substrate 201.

Furthermore, Japanese Patent Laid-Open No. 2003-174124 discloses another technique of exposing a flattened distal end face of a projected electrode from an upper face of a molding resin portion. First, a projected electrode for external electrode formation is formed on a substrate with a semiconductor element joined to a front face thereof. The substrate is then set in a molding mold. Next, by performing compression molding on resin supplied to a front face-side of the substrate, a molding resin portion is formed which molds the semiconductor element and the projected electrode with resin. At this point, the compression force during resin molding compresses the projected electrode using an inner face (molding face) of the molding mold so as to squash the projected electrode by at least 5 percent. Consequently, the flattened distal end face of the projected electrode can be exposed from the upper face of the molding resin portion.

DISCLOSURE OF THE INVENTION

An object of the present invention is to provide a semiconductor device capable of realizing three-dimensional mounting with higher reliability than the conventional semiconductor devices described above, and a method of manufacturing the semiconductor device.

In order to achieve the object, a semiconductor device according to the present invention includes: a substrate; a semiconductor element mounted in an element mounting region of the substrate; a molding resin portion formed on the substrate so as to embed the semiconductor element; and a projected electrode formed in a region outside of the element mounting region of the substrate and having a protruding portion that protrudes from the front face of the molding resin portion, the distal end of the protruding portion being a flat face and a portion of the projected electrode whose cross section is greater than the protruding portion being positioned inside the molding resin portion.

According to the configuration described above, the protruding portion of the projected electrode protrudes from the front face of the molding resin portion and the distal end of the protruding portion is a flat face. Therefore, when configuring a semiconductor apparatus with a three-dimensional mounting structure such as a PoP semiconductor apparatus, by using the present semiconductor device as a lower-level semiconductor device, a rear-face projected electrode of another semiconductor device stacked on an upper level can be stably joined to the distal end face of the projected electrode of the lower-level semiconductor device. In other words, when mounting a semiconductor device whose rear-face projected electrode has a spherically-shaped distal end such as a BGA (Ball Grid Array) semiconductor device, since the distal end face of a projected electrode of a lower-level semiconductor device is flat, an upper-level semiconductor device is not horizontally displaced and variations in horizontal mounting positions of the upper-level semiconductor device can be suppressed even when the pressing force during mounting presses the rear-face projected electrode in a vertical direction against the distal end face of the projected electrode of the lower-level semiconductor device. Therefore, a semiconductor apparatus with a highly reliable three-dimensional mounting structure can be realized.

In addition, since the portion of the projected electrode whose cross section is greater than the protruding portion of the projected electrode is positioned in the molding resin portion, even when longitudinal stress is generated at the projected electrode after mounting a semiconductor apparatus with a three-dimensional mounting structure configured using the present semiconductor device, a lateral face of the projected electrode and the molding resin are unlikely to separate from each other and the projected electrode and the substrate are also unlikely to separate from each other. Furthermore, tilting or dislodging of the projected electrode is unlikely to occur between fixing of the projected electrode to the substrate and performing molding with resin. Therefore, a semiconductor apparatus with a highly reliable three-dimensional mounting structure can be realized.

In this case, the cross section of the projected electrode in a direction along the substrate front face is favorably circular. Since such a shape is free of stress concentration areas and stress is distributed, the effects of preventing separation between a lateral face of the projected electrode and the molding resin, preventing separation between the projected electrode and the substrate, and preventing tilting or dislodging of the projected electrode can be enhanced.

Moreover, the projected electrode is favorably made up of solder. This is because a flat face can be readily formed with a soft material such as solder.

A semiconductor device according to the present invention includes: a substrate; a semiconductor element mounted in an element mounting region of the substrate; a molding resin portion formed on the substrate so as to embed the semiconductor element; and a projected electrode formed in a region outside of the element mounting region of the substrate and having a depressed portion at the distal end thereof, the depressed portion being exposed from the front face of the molding resin portion.

In this case, at least a portion of a lateral wall of the depressed portion of the projected electrode may be given one of a tapered shape, an arc shape, and a multilevel shape.

A semiconductor device according to the present invention includes: a substrate; a semiconductor element mounted in an element mounting region of the substrate; a molding resin portion formed on the substrate so as to embed the semiconductor element and provided with a depressed portion; and a projected electrode formed in a region outside of the element mounting region of the substrate and having a distal end exposed from the depressed portion of the molding resin portion.

In this case, at least a portion of a lateral wall of the depressed portion of the molding resin portion may be given one of a tapered shape, an arc shape, and a multilevel shape.

In addition, the projected electrode may be provided with a depressed portion at the distal end thereof, whereby the depressed portion may be exposed from the depressed portion of the molding resin portion, and at least a portion of a lateral wall of the depressed portion of the projected electrode may be given one of a tapered shape, an arc shape, and a multilevel shape.

According to the configuration described above, since either a depressed portion is formed on a distal end-face of the projected electrode that is exposed from the front face of the molding resin portion or the distal end of the projected electrode is exposed from a depressed portion formed on the front face of the molding resin portion, by using the described semiconductor device as a lower-level semiconductor device when configuring a semiconductor apparatus with a three-dimensional mounting structure such as a PoP semiconductor apparatus, a rear-face projected electrode of another semiconductor device to be stacked on an upper level can be lowered into the depressed portion, thereby enabling positional regulation. Therefore, variations in horizontal-direction mounting positions of the upper-level semiconductor device can be suppressed. In addition, by varying the size (depth and/or width) of the depressed portion, the mounting height of the other semiconductor device to be stacked on the upper level can be varied. Therefore, a semiconductor apparatus with a highly reliable three-dimensional mounting structure can be realized.

The semiconductor element mounting structure may either involve a connection by wire bonding to a connecting terminal disposed in a region outside of an element loading region (outer peripheral region of an element mounting region) or a flip-chip connection to a connecting terminal disposed in an element loading region (element mounting region). In the case of a flip-chip connection, a connecting terminal need not be provided in a region outside of the element loading region. Since the element loading region effectively becomes the element mounting region, downsizing of the substrate can be achieved. Consequently, a projected plane of the semiconductor device is reduced, making the semiconductor device two-dimensionally mountable at high density on a mounting substrate or the like.

In addition, by flip-chip connecting another semiconductor element on top of a semiconductor element provided with a connecting electrode at the center of the principal face thereof, a plurality of semiconductor elements may be three-dimensionally stack-mounted on a substrate. Consequently, a semiconductor device more suitable for high-density mounting than a semiconductor device intended for two-dimensional mounting can be achieved.

A method of manufacturing a semiconductor device according to the present invention includes the steps of: setting a substrate, which has a semiconductor element mounted in an element mounting region and a projected electrode whose end is shaped so as to gradually narrow formed in a region outside of the element mounting region, into a molding mold having a release sheet adhered to the molding face thereof; pressing the end of the projected electrode against the release sheet and, at the same time, forming a molding resin portion that performs molding over the substrate with resin so as to embed the semiconductor element; and extracting a resin-molded molded body from the molding mold.

According to the method of manufacturing a semiconductor device described above, since the end of the projected electrode is pressed against the release sheet, the end of the projected electrode protrudes from an upper face of the molding resin portion and the distal end of the end of the projected electrode is squashed so as to form a flat face. In addition, since a projected electrode whose end has a gradually narrowing shape is used, resin does not penetrate between the projected electrode and the release sheet. Therefore, there is no need to remove resin flash or perform cleaning after the resin molding process. As a result, manufacturing lead time and the number of manufacturing processes can be reduced, which in turn enables cost reduction to be achieved.

In this case, the release sheet favorably has a laminated structure made up of a flexible and elastic layer and a high hardness layer. This is because a flatter plane can be obtained due to the end of the projected electrode squashing the flexible and elastic layer to be pressed against the high hardness layer via the squashed flexible and elastic layer.

A method of manufacturing a semiconductor device according to the present invention includes the steps of: setting a substrate, which has a semiconductor element mounted in an element mounting region and a projected electrode formed in a region outside of the element mounting region, into a molding mold; pressing the end of the projected electrode against the inner face of the molding mold and, at the same time, forming a molding resin portion that performs molding over the substrate with resin so as to embed the semiconductor element; extracting a resin-molded molded body from the molding mold; and forming a depressed portion on a distal end face of the projected electrode exposed from the front face of the molding resin portion.

A method of manufacturing a semiconductor device according to the present invention includes the steps of: setting a substrate, which has a semiconductor element mounted in an element mounting region and a projected electrode formed in a region outside of the element mounting region, into a molding mold; forming a molding resin portion that performs molding over the substrate with resin so as to embed the semiconductor element; extracting a resin-molded molded body from the molding mold; and forming a depressed portion on the front face of the molding resin portion and exposing the distal end of the projected electrode from the depressed portion.

In this case, when forming the molding resin portion, the end of the projected electrode may be pressed against the inner face of the molding mold.

In addition, a depressed portion may further be formed on the distal end of the projected electrode exposed from the depressed portion of the molding resin portion.

A method of manufacturing a semiconductor device according to the present invention includes the steps of: setting a substrate, which has a semiconductor element mounted in an element mounting region and a projected electrode formed in a region outside of the element mounting region, into a molding mold; pressing the end of the projected electrode against one of a convex portion formed on an inner face of the molding mold and a convex portion formed on the inner face of the molding mold as well as a peripheral portion of the convex portion formed on the inner face of the molding mold and, at the same time, forming a molding resin portion that performs molding over the substrate with resin so as to embed the semiconductor element; and extracting a resin-molded molded body from the molding mold.

In this case, the convex portion formed on the inner face of the molding mold may be shaped so as to form one of a tapered shape, an arc shape and a multilevel shape on at least a part of an inner wall of a depressed portion of the projected electrode or shaped so as to form one of a tapered shape, an arc shape and a multilevel shape on at least a part of an inner wall of a depressed portion of the molding resin portion.

In addition, when forming the molding resin portion, the end of the projected electrode may be pressed against a distal end face of the convex portion formed on the inner face of the molding mold. The convex portion formed on the inner face of the molding mold may be provided with a convex portion whose diameter is smaller than the distal end face on the distal end face, against which the end of the projected electrode is to be pressed, and the small-diameter convex portion may be shaped so as to form one of a tapered shape, an arc shape and a multilevel shape on at least a part of an inner wall of the depressed portion of the projected electrode.

Furthermore, it is favorable that either the temperature at which the molding resin portion is formed is set to a temperature lower than the melting point of the projected electrode or the projected electrode is formed by a material having a melting point that is higher than the temperature at which the molding resin portion is formed.

According to the present invention, the joint reliability of a semiconductor apparatus with a three-dimensional mounting structure can be enhanced, and a PoP semiconductor apparatus can be readily configured with high reliability and at low cost. As such, the present invention is useful in various electronic devices and, in particular, in mobile electronic devices.

DESCRIPTION OF THE EMBODIMENTS

Hereinafter, embodiments of the present invention will be described with reference to the drawings. It should be noted that thicknesses, lengths, the numbers of electrodes or the like of the respective members shown in the respective diagrams may differ from actual values.

First Embodiment

Figure 1:
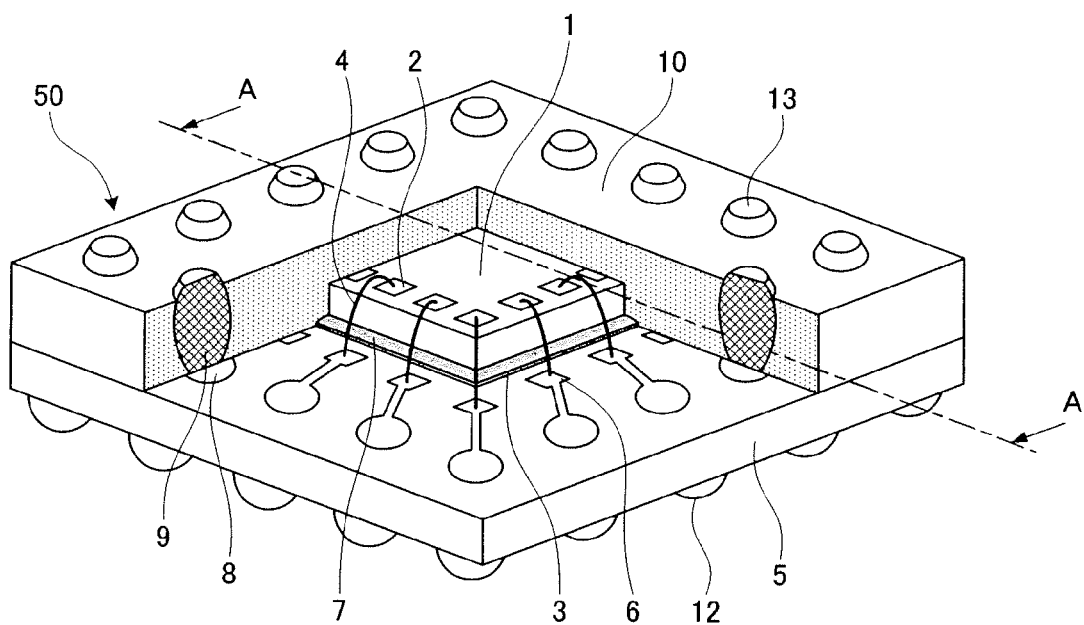
FIG. 1 is a perspective view showing the configuration of a semiconductor device according to a first embodiment of the present invention.
Figure 2:
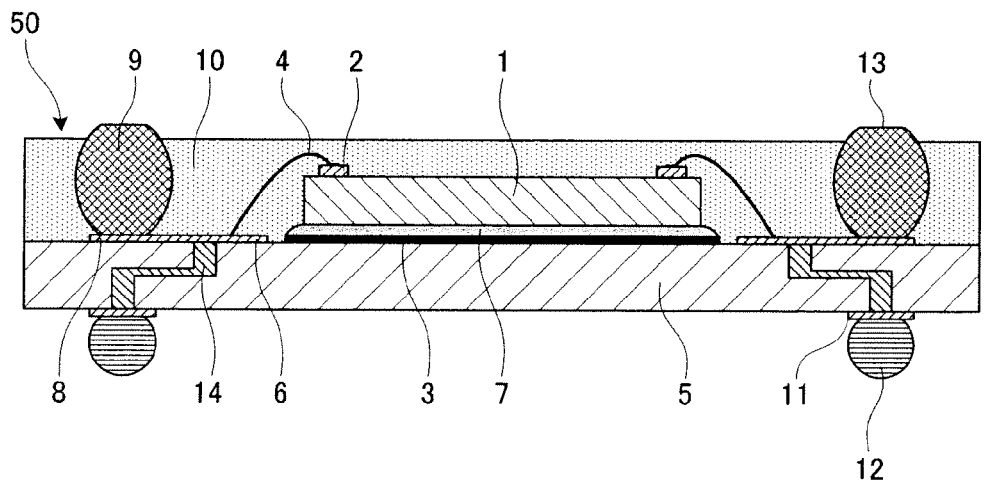
FIG. 2 is a cross-sectional view showing the configuration of the semiconductor device according to the first embodiment of the present invention.

FIG. 1 is a perspective view showing a partially cutaway semiconductor device according to a first embodiment of the present invention, and FIG. 2 is a cross-sectional view of the semiconductor device taken along line A-A in FIG. 1.

In FIGS. 1 and 2, a semiconductor device 50 includes: a substrate 5; a semiconductor element 1 mounted in an element mounting region on one face (a front face) of the substrate 5 and electrically connected to the substrate 5 via a thin metallic wire 4; and a molding resin portion 10 formed on the front face of the substrate 5 so as to embed the semiconductor element 1 and the thin metallic wire 4.

The substrate 5 includes: a die pattern 3 and a plurality of connecting terminals 6 in the element mounting region on the front face; a plurality of laminated lands 8, respectively connected to the plurality of connecting terminals 6, in a region outside of the element mounting region; and a plurality of rear-face lands 11, respectively connected to the plurality of laminated lands 8, on the other face (a rear face that is opposite to the front face) of the substrate 5.

Projected electrodes 9 for establishing an electrical connection to another semiconductor device is provided on the laminated lands 8, while rear-face projected electrodes 12 for establishing an electrical connection to a mounting substrate are provided on the rear-face lands 11. As for the projected electrodes 9, a protruding portion (an end) protrudes from an upper face of the molding resin portion 10, the distal end of the protruding portion is a flat face 13, and a portion with a cross section greater than the protruding portion is positioned within the molding resin portion 10. The laminated lands 8 are lands formed on the substrate 5 for the purpose of establishing electrical connection via the projected electrodes 9 with rear-face electrodes of another semiconductor device to be stacked on top of the semiconductor device 50 when configuring a PoP semiconductor apparatus.

As for the semiconductor element 1, an internal circuit is formed in the center on a principal face and a plurality of electrode terminals 2 connected to the internal circuit is disposed in the outer periphery of the principal face. While the semiconductor element 1 uses silicon as a base material, the base material may alternatively be a single element material such as germanium or graphite or a compound material such as gallium arsenide or zinc telluride. The thickness of the semiconductor element 1 is set to within, for example, 50 µm to 200 µm, and favorably around 100 µm.

The semiconductor element 1 is fastened on top of the die pattern 3 of the substrate 5 by an adhesive 7 and is electrically connected to the connecting terminals 6 via the thin metallic wires 4. The adhesive 7 may include at least one selected from an epoxy resin, a polyimide resin, and an acrylic resin, and may be one of solder and a gold-silicon eutectic crystal. In addition, the adhesive 7 may be either conductive or insulative, and may be an ultraviolet-curable adhesive mixed with a photo initiator. For example, a silver filler-added conductive epoxy adhesive can be used. In addition, the adhesive 7 may take the form of a paste or a partially-cured sheet. A gold wire is used as the thin metallic wires 4 which may alternatively be, for example, one of a copper wire, an aluminum wire, and a silver wire. The loop height of the thin metallic wires 4 from the front face of the substrate 5 is set to within, for example, 40 µm to 250 µm, and favorably around 130 µm.

The substrate 5 includes: a wiring pattern, the connecting terminals 6 and the laminated lands 8 formed by a conductive membrane on the front face of the substrate; a wiring pattern and the rear-face lands 11 formed by a conductive membrane on the rear face of the substrate; and conductors (formed from a conductive membrane or a conductive filler) such as vias 14 that electrically connect the wiring patterns on both faces either directly or via an intermediate wiring layer. The aforementioned die pattern 3 is formed at the center of the front face of the substrate 5, and the plurality of connecting terminals 6 and the plurality of laminated lands 8 respectively connected thereto are radially disposed as seen from the central die pattern 3 in a region further towards the outer periphery than the die pattern 3. The connecting terminals 6 and the laminated lands 8 are connected via the wiring pattern formed on the front face of the substrate 5. The rear-face lands 11 to be connected to the laminated lands 8 via the vias 14 and the like are disposed on the rear face of the substrate 5. The rear-face lands 11 are connected to the wiring pattern formed on the rear face of the substrate 5.

Various resin substrates can be used as the substrate such as those cured by impregnating a glass fiber or a fiber made up of an organic substance such as Kevlar (registered trademark) with an epoxy resin, a phenol resin, a polyimide resin or the like, or those using a BT resin or a liquid crystal polymer. The resin substrate may be one of a monolayer substrate and a multilayer substrate. Otherwise, a monolayer or multilayer ceramic substrate constituted by any one of aluminum oxide, aluminum nitride, glass, and quartz may be used. The thickness of the substrate 5 is set to within, for example, 100 µm to 600 µm, and favorably around 210 µm.

While copper foil is used as the conductive membrane, a metal layer may be formed on top of the copper foil. The metal layer may include at least one selected from, for example, nickel, solder, gold, silver, palladium, and the like. When the substrate is made up of a sintered material such as aluminum oxide or aluminum nitride, a configuration is to be adopted in which a conductive membrane formed by any one high-melting-point metal of tungsten, manganese, molybdenum, and tantalum is covered by any one conductive material of gold, silver, copper, and palladium. When the substrate is made up of a transparent material such as glass or quartz, the conductive membrane may be constituted by a transparent conductive material such as tin chloride.

The molding resin portion 10 is formed across the entire front face of the substrate 5 so as to embed the semiconductor element 1, the thin metallic wires 4, and the projected electrodes 9 (excluding the protruding portions). While a thermosetting epoxy resin is used as the material of the molding resin portion 10, for example, any one of a biphenyl resin, a phenol resin, a silicone resin, and a cyanate ester resin may be used. In addition, for example, the molding resin portion 10 may include at least one resin selected from a bisphenol A type resin, a bisphenol F type resin, a biphenyl type resin, and a naphthalene type resin. The thickness of the molding resin portion 10 i.e., the dimension from the front face of the substrate to the upper face of the molding resin portion 10 is set to within, for example, 120 µm to 400 µm, and favorably around 200 µm.

As for the projected electrodes 9, a cross section in a direction along the front face of the substrate is circular, and a portion whose cross section is greater than the protruding portion protruding from the upper face of the molding resin portion 10 (hereinafter referred to as a large diameter portion) is positioned within the molding resin portion 10. In this case, the projected electrodes 9 are barrel-shaped electrodes whose diameter is the greatest at the axial center. The height of the protruding portion is set to within, for example, 5 µm to 60 µm and favorably around 20 µm, while the diameter of the large diameter portion is set to within 100 µm to 300 µm. The diameter of the flat face 13 is set to be within 40 µm to 250 µm.

The projected electrodes 9 may be constituted by, for example, one of a zinc alloy, a tin alloy, a bismuth alloy, and a silver alloy. More specifically, any one solder material of Sn—Ag—Cu solder, Sn—Pb solder, Sn—Ag—Bi—In solder, and Sn—Zn—Bi solder may be used.

Similarly, for the rear-face projected electrodes 12, a solder material such as Sn—Ag—Cu solder, Sn—Pb solder, Sn—Ag—Bi—In solder, and Sn—Zn—Bi solder may be used.

The projected electrodes 9 and the rear-face projected electrodes 12 may be configured such that a solder layer is formed on an upper layer or the entire front face of a core made up of copper or nickel.

In addition, as the projected electrodes 9 and the rear-face projected electrodes 12, plated bumps made up of one of Au, Ni, and Cu, bumps in which metal plating is performed on a resin core, or composite bumps in which Au stud bumps are topped with a conductive paste may be used.

A method of manufacturing the aforementioned semiconductor device 50 will now be described with reference to FIGS. 3 to 9.

Figure 3:
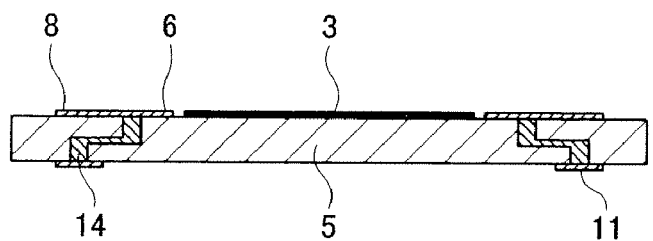
FIG. 3 is a process cross-sectional view for describing a process of manufacturing the semiconductor device according to the first embodiment of the present invention.

First, as shown in FIG. 3, the aforementioned substrate 5 is prepared. In the substrate 5, the die pattern 3 is formed at the center of the front face, the pluralities of connecting terminals 6 and laminated lands 8 are formed in a region further towards the outer periphery than the die pattern 3, and the plurality of rear-face lands 11 that connect to the respective laminated lands 8 via conductors such as the vias 14 are formed on the rear face.

A brief description will now be given on a method of preparing the substrate 5. First, a conductive membrane is formed on both faces of the substrate. Next, the conductive membrane on one of the faces is processed into a predetermined shape using a photolithographic method to form a wiring pattern, the connecting terminals 6, and the laminated lands 8. The conductive membrane on the other face is also processed into a predetermined shape using a photolithographic method to form a wiring pattern and the rear-face lands 11, and the wiring patterns on both faces are electrically connected together by the vias 14 or the like. Subsequently, an insulating film such as a solder resist is formed at regions on both sides of the substrate other than the respective connecting portions of the connecting terminals 6, the laminated lands 8, and the rear-face lands 11. The substrate 5 may be a multilevel substrate provided with at least one intermediate wiring layer.

Figure 4:
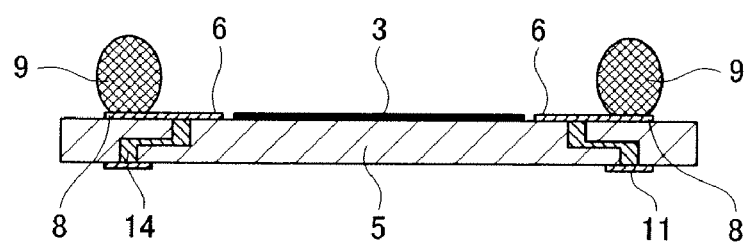
FIG. 4 is a process cross-sectional view for describing a process of manufacturing the semiconductor device according to the first embodiment of the present invention.

Next, as shown in FIG. 4, the ball-shaped projected electrodes 9 are joined to the plurality of laminated lands 8 on the substrate 5. In this case, projected electrodes 9 with elliptical cross sections are used. For example, if the projected electrodes 9 are made up of a solder material, the projected electrodes 9 may be formed as described below. While supplying a solder paste on the plurality of laminated lands 8 using a printing method, the projected electrodes 9 are adsorbed by an adsorption apparatus (not shown) having adsorption holes at a plurality of locations respectively corresponding to the plurality of laminated lands 8, whereby the respective projected electrodes 9 are conveyed to positions consistent with the laminated lands 8 and placed on the aforementioned solder paste. Subsequently, the projected electrodes 9 are joined onto the laminated lands 8 by reflow in an inert gas atmosphere. The method of forming the projected electrodes 9 is not limited to the above-described method and, for example, one of a printing method, a plating method and a stud method may be used depending on the material of the projected electrodes. In addition, even in the case of a solder material, the projected electrodes 9 may be formed using, for example, one of a printing method and a plating method.

The height of the projected electrodes 9 in this case from the front face of the substrate to distal ends is set to within, for example, 135 μm to 460 μm, and favorably around 270 μm.

Figure 5:
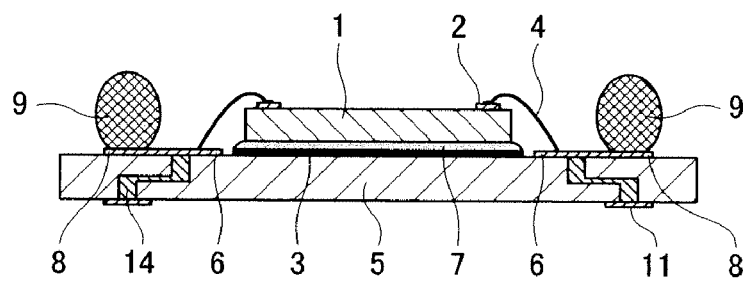
FIG. 5 is a process cross-sectional view for describing a process of manufacturing the semiconductor device according to the first embodiment of the present invention.

Next, as shown in FIG. 5, the semiconductor element 1 is bonded onto the die pattern 3 of the substrate 5. To do so, the adhesive 7 is first supplied onto the die pattern 3. If the adhesive 7 is in paste form, for example, the adhesive 7 may be printed and applied with an adequate thickness by screen printing or an appropriate amount may be applied at multiple points using a multinozzle dispenser. If the adhesive 7 is a partially-cured sheet, an appropriately-sized sheet is placed. Then, the semiconductor element 1 is placed at a predetermined position on the adhesive 7 and heated in an inert gas or under reduced pressure to cure the adhesive 7. Subsequently, electrode terminals 2 of the semiconductor element 1 and corresponding connecting terminals 6 on the substrate 5 are connected by wire bonding using the thin metallic wires 4 whose diameter is set to within, for example, 10 μm to 40 μm and favorably around 18 μm.

Figure 6:
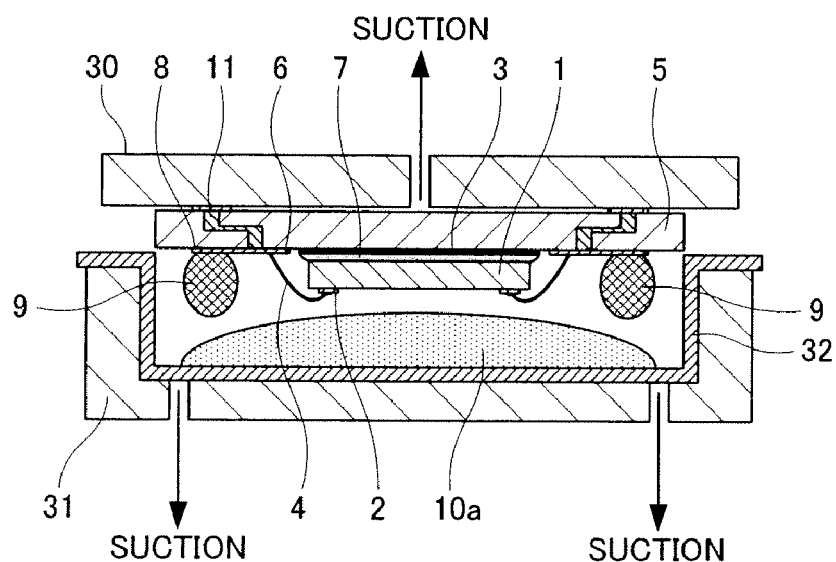
FIG. 6 is a process cross-sectional view for describing a process of manufacturing the semiconductor device according to the first embodiment of the present invention.

Next, as shown in FIG. 6, the substrate 5 is set into an upper mold 30 and a lower mold 31 of a compression molding press for molding with resin and a molding resin material 10a is supplied. In other words, the upper mold 30 and the lower mold 31 are set to a predetermined resin melting temperature, a release sheet 32 covering a molding face is attached firmly by suction to the lower mold 31, the substrate 5 is retained in the upper mold 30 by suction and, at the same time, an amount of the granular molding resin material 10a required for performing molding with resin is supplied onto the release sheet 32 in a cavity region. Besides the granular form, the molding resin material 10a may take one of a liquid form, a mini-tablet form, and a sheet form.

Figure 10:
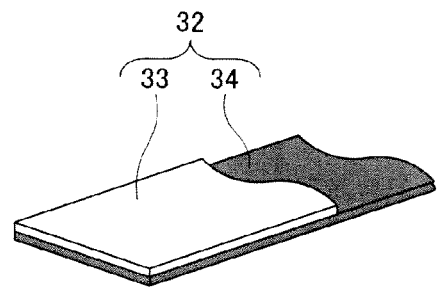
FIG. 10 is a diagram for describing the configuration of a release sheet to be used in the process of manufacturing the semiconductor device according to the first embodiment of the present invention.

In this case, the release sheet 32 is strippable with respect to the molding resin material 10a (and parts molded therefrom). The release sheet 32 may be either a monolayer sheet made up of one of, for example, a polytetrafluoroethylene (PTFE) resin, an ethylene-tetrafluoroethylene copolymer (ETFE) resin, a tetrafluoroethylene-perfluoropropylene copolymer (FEP) resin, a polyvinylidene-fluoride (PVDF) resin, a polyethylene terephthalate (PET) resin, a polypropylene (PP) resin and silicone rubber (SR), or a multilayer sheet. As shown in FIG. 10, the release sheet 32 favorably has a laminated structure made up of a flexible and elastic first layer 33 and a high hardness second layer 34. The first layer 33 may be any one of the respective resins and rubber described above, while a metal film made up of, for example, one of nickel, an iron-nickel alloy and copper may be used as the second layer 34. When using a laminated release sheet 32, the second layer 34 is disposed so as to be into contact with the lower mold 31. According to this arrangement, the strength of the release sheet 32 is increased and breakage or the like during the compression molding process can be avoided. The thickness of the release sheet 32 is set to within 30 μm to 100 μm, and favorably around 50 μm.

Figure 7:
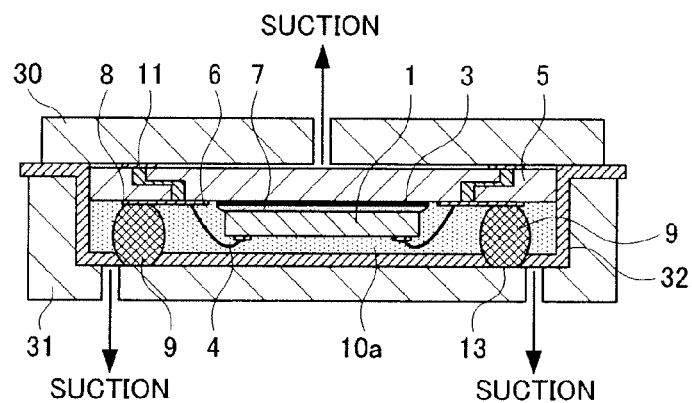
FIG. 7 is a process cross-sectional view for describing a process of manufacturing the semiconductor device according to the first embodiment of the present invention.
Figure 8:
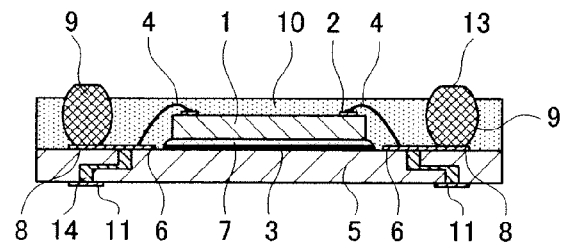
FIG. 8 is a process cross-sectional view for describing a process of manufacturing the semiconductor device according to the first embodiment of the present invention.

Next, as shown in FIGS. 7 and 8, compression molding is performed using the upper mold 30 and the lower mold 31 to mold the semiconductor element 1, the thin metallic wires 4, and the projected electrodes 9 with resin. To this end, the lower mold 31 retaining the melted molding resin material 10a is elevated to a predetermined position while the space between the upper mold 30 and the lower mold 31 is depressurized using an exhaust unit (not shown). The position to which the lower mold 31 is elevated is set to a position where the release sheet 32 is pressed against the upper mold 30 and which a cavity corresponding to a predetermined resin molding thickness is formed between the front face of the substrate 5 retained in the upper mold 30 by suction and the release sheet 32. At this point, since the ends of the projected electrodes 9 penetrate into the release sheet 32 while having the distal ends of the ends shaped into the flat faces 13, the material and/or thickness of the release sheet 32 is adequately selected in advance so that the penetration reaches to a predetermined depth. The penetration depth is set to within, for example, 5 μm to 60 μm, and favorably around 20 μm. This state is retained until the molding resin material 10a cures, after which the molded part is extracted.

Figure 9:
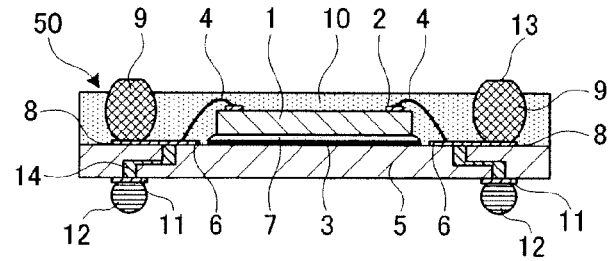
FIG. 9 is a process cross-sectional view for describing a process of manufacturing the semiconductor device according to the first embodiment of the present invention.

Subsequently, as shown in FIG. 9, the rear-face projected electrodes 12 are formed on the rear-face lands 11 of the substrate 5. If the rear-face projected electrodes 12 are of, for example, a solder material, the formation of the rear-face projected electrodes 12 may involve, for example, one of using a ball setting method in which solder balls or the like are mounted and using a printing method in which a solder paste is supplied onto the rear-face lands 11 and subjected to reflow to create projected shapes. The method of forming the rear-face projected electrodes 12 is not limited to the above-described methods and, for example, one of a printing method, a plating method and a stud method may be used depending on the material of the projected electrodes. In addition, even in the case of a solder material, the rear-face projected electrodes 12 may be formed using, for example, a plating method.

Moreover, by irradiating plasma on the distal end faces of the projected electrodes 9 to remove organic elements such as an oxide film and a resin wax adhered to the faces, preferable solder joints can be realized when stacking another semiconductor device on the upper side.

According to the manufacturing method described above, the molding resin portion 10 covering the entire front face of the substrate 5 is formed so as to embed the semiconductor element 1, the thin metallic wires 4, and the projected electrodes 9, the ends of the projected electrodes 9 pressed against and penetrating the release sheet 32 during the compression molding process protrude from the upper face of the molding resin portion 10, and the distal ends of the ends (protruding portions) of the projected electrodes 9 are shaped into the flat faces 13. In a case where the release sheet 32 has a laminated structure including the flexible and elastic first layer 33 and the high hardness second layer 34, since the ends of the projected electrodes 9 squash the first layer 33 and are pressed against the second layer 34 via the squashed first layer 33, flat faces 13 that are increasingly flat can be obtained.

Furthermore, since the projected electrodes 9 are ball-shaped prior to molding with resin or, in other words, since the ends of the projected electrodes 9 have a gradually narrowing shape, the molding resin material 10a does not penetrate between the ends of the projected electrodes 9 and the release sheet 32. Therefore, there is no need to remove resin flash or perform cleaning after the resin molding process. Moreover, since the large diameter portion whose cross section is greater than the protruding portion is positioned inside the molding resin portion 10, the projected electrodes 9 and the molding resin portion 10 are unlikely to separate from each other and the projected electrodes 9 and the laminated lands 8 are also unlikely to separate from each other. Consequently, disconnection at junctions of the projected electrodes 9, displacement of the protruding portions (in particular, the flat faces 13), and loss of the projected electrodes 9 can be prevented.

In addition, since the thin metallic wires 4 are immersed at low speed into the low-viscosity molding resin material 10a that is sufficiently melted during the compression molding process, deformation of the thin metallic wires 4 can also be prevented.

By using the obtained semiconductor device 50 as a lower-level semiconductor device when configuring a PoP semiconductor apparatus with a three-dimensional mounting structure, variations in the two-dimensional positional relationship between an upper-level semiconductor device and the lower-level semiconductor device can be suppressed. In other words, when mounting an upper-level semiconductor device in which the distal ends of rear-face projected electrodes have a spherical shape, the upper-level semiconductor device is not horizontally displaced when the rear-face projected electrodes are pressed by the pressure of mounting against the flat faces 13 of the projected electrodes 9 of the semiconductor device 50 in a vertical direction, and variations in the horizontal mounting position of the upper-level semiconductor device can be suppressed. As a result, the upper-level semiconductor device can be joined in a stable manner and junction reliability can be enhanced. A PoP semiconductor apparatus can now be prepared in an easier and less expensive manner.

While a case where the release sheet 32 is disposed only in the lower mold during compression molding has been described in the present first embodiment, the release sheet 32 can be additionally disposed in the upper mold. By doing so, since the substrate can be prevented from coming into contact with the upper mold, damages to the rear-face lands can be avoided. In addition, while a case where the molding resin portion is compression-molded has been described in the present first embodiment, transfer molding can be performed instead. When performing transfer molding, a release sheet is disposed on a molding face of a molding mold, whereby the ends of the projected electrodes are pressed against the release sheet by pressing force generated when clamping the substrate with the molding mold.

The flat faces 13 can be readily formed if the material of the projected electrodes 9 is solder. In addition, by using a laminated structure in which a thin elastic layer and a high hardness layer are laminated as the release sheet 32, since the ends of the projected electrodes 9 penetrate the elastic layer and abut the high hardness layer, an even flatter face can be obtained.

In practice, the semiconductor device 50 described above is not manufactured one by one. A method (MAP method) is adopted in which a plurality of semiconductor devices is collectively manufactured using a substrate for multi-unit manufacturing, and either before or after forming the rear-face projected electrodes 12 on the rear-face lands 11, separation is performed by a dicer or a laser.

Figure 11:
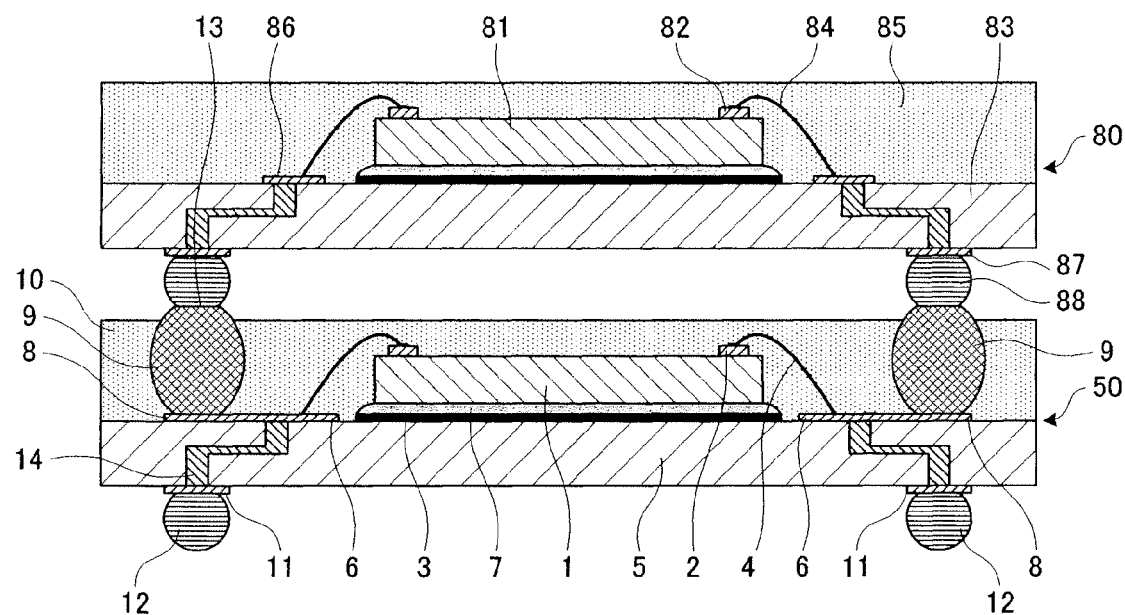
FIG. 11 is a cross-sectional view of a PoP semiconductor apparatus using the semiconductor device according to the first embodiment of the present invention.

FIG. 11 is a cross-sectional view of a PoP semiconductor apparatus. A BGA (Ball Grid Array) semiconductor device 80 is three-dimensionally mounted on top of the semiconductor device 50 described above.

In the BGA semiconductor device 80, a semiconductor element 81 is mounted on the front face of a substrate 83, connecting electrodes 82 and connecting terminals 86 are electrically connected together by thin metallic wires 84, the semiconductor element 81 and the thin metallic wires 84 are molded with resin at a molding resin portion 85 formed using a compression molding method or a transfer molding method, and rear-face projected electrodes 88 are joined on rear-face lands 87 on the rear face of the substrate 83. The rear-face lands 87 and the rear-face projected electrodes 88 are disposed at positions corresponding to the projected electrodes 9 of the semiconductor device 50, and the respective rear-face projected electrodes 88 are joined on the flat faces 13 of the distal ends of the projected electrodes 9.

With this PoP semiconductor apparatus, in addition to joint stability and high reliability acquired due to the projected electrodes 9 of the semiconductor device 50, three-dimensional densification enables higher performance, a lower profile and a smaller size. Therefore, by using this PoP semiconductor apparatus, microminiaturization of mobile terminals and home appliances can be achieved.

Figure 12:
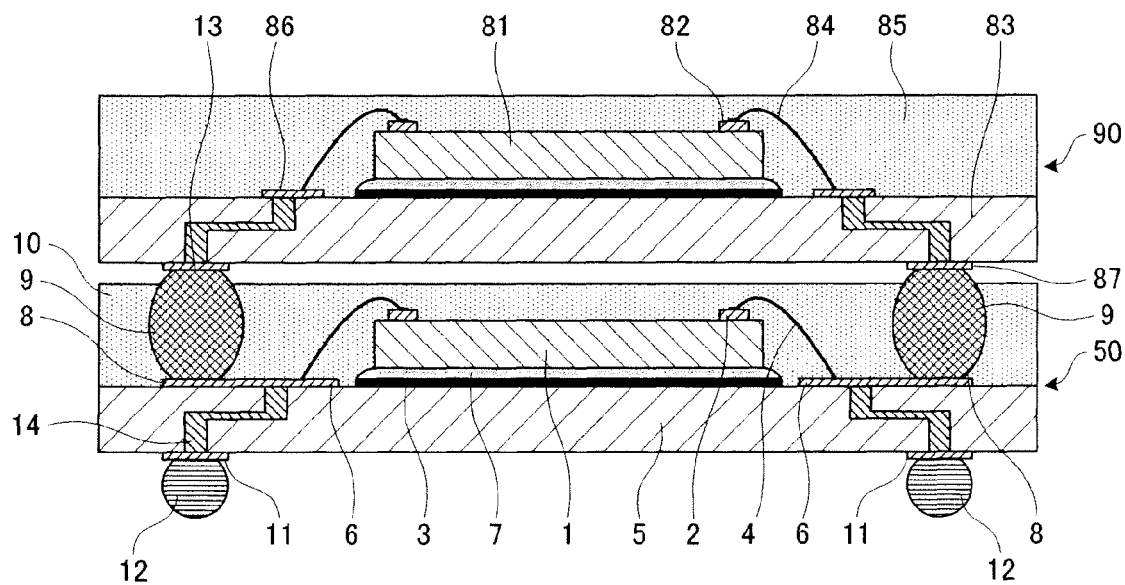
FIG. 12 is a cross-sectional view of another PoP semiconductor apparatus using the semiconductor device according to the first embodiment of the present invention.

FIG. 12 is a cross-sectional view of another PoP semiconductor apparatus. An LGA (Land Grid Array) semiconductor device 90 is three-dimensionally mounted on top of the semiconductor device 50 described above.

The only difference of the LGA semiconductor device 90 from the BGA semiconductor device 80 shown in FIG. 11 is that rear-face projected electrodes are not provided on the rear-face lands 87 and that the rear-face lands 87 are joined directly on to the flat faces 13 on the distal ends of the projected electrodes 9.

With this PoP semiconductor apparatus also, in addition to joint stability and high reliability acquired due to the projected electrodes 9 of the semiconductor device 50, three-dimensional densification and a lower profile than the PoP semiconductor apparatus shown in FIG. 11 due to the absence of rear-face projected electrodes enable higher performance, a lower profile and a smaller size. Therefore, by using this PoP semiconductor apparatus, microminiaturization of mobile terminals and home appliances can be achieved.

The semiconductor elements 1 and 81 respectively mounted on the semiconductor device 50, the BGA semiconductor device 80, and the LGA semiconductor device 90 need not always be mounted face-up as shown on the substrates 5 and 83 and connected by the thin metallic wires 4 and 84, and may instead be flip-chip connected.

Second Embodiment

Figure 13:
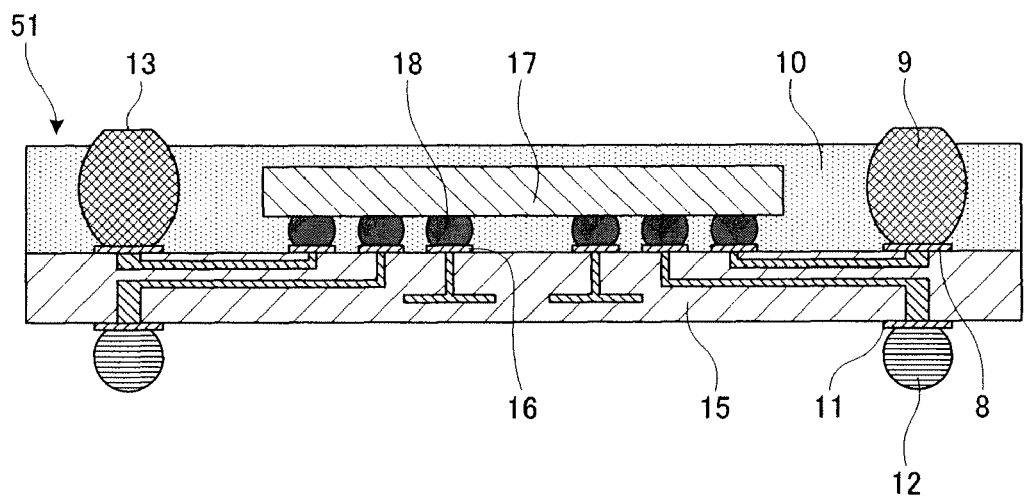
FIG. 13 is a cross-sectional view showing the configuration of a semiconductor device according to a second embodiment of the present invention.

FIG. 13 is a cross-sectional view showing the configuration of a semiconductor device according to a second embodiment of the present invention. The same members as the members described earlier in the first embodiment are assigned the same reference characters and descriptions thereof will be omitted. Thus, only points that differ from the semiconductor devices according to the above-described first embodiment shall be described. In a semiconductor device 51 according to the present second embodiment, a semiconductor element 17 is mounted on a substrate 15 using a flip-chip method. A plurality of bumps 18 connected to an internal circuit is formed at predetermined positions on the principal face of the semiconductor element 17. Semiconductor element lands 16 are formed in the center of the front face of the substrate 15 in an arrangement corresponding to the bumps 18 of the semiconductor element 17. The substrate 15 does not have the die patterns and connecting terminals described earlier in the first embodiment. A laminated land 8 and a rear-face land 11 are connected to each semiconductor element land 16.

With this semiconductor device 51 also, since projected electrodes 9 similar to the projected electrodes of the first embodiment described earlier are provided, a stable junction can be obtained when configuring a PoP semiconductor apparatus with a three-dimensional mounting structure and higher reliability can be achieved. Meanwhile, with this semiconductor device 51, in comparison with the semiconductor devices according to the first embodiment described earlier, since semiconductor element lands need only be disposed within an element mounting region of the substrate or, in other words, since there is no need to dispose connecting terminals outside the element mounting region as is the case with wire bonding, a larger-sized semiconductor element as compared to the case of wire bonding can be mounted in an element mounting region of the same area.

For example, the bumps of the semiconductor element 17 may be either bumps formed from one of a zinc alloy, a tin alloy, a bismuth alloy and a silver alloy, or bumps in which a solder layer is formed on an upper layer or the entire front face of a core formed by electrolytic/nonelectrolytic plating and made up of one of copper and nickel.

Third Embodiment

Figure 14:
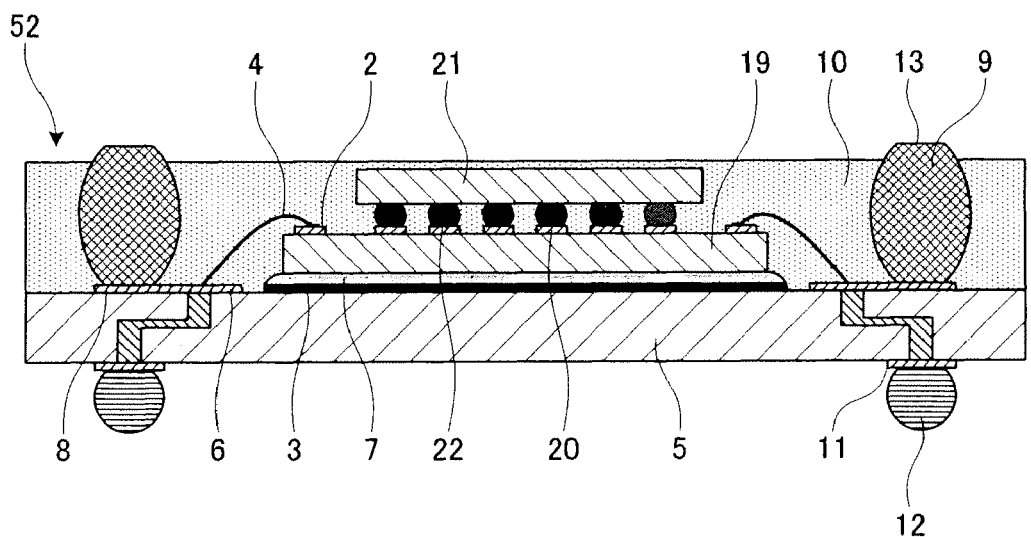
FIG. 14 is a cross-sectional view showing the configuration of a semiconductor device according to a third embodiment of the present invention.

FIG. 14 is a cross-sectional view showing the configuration of a semiconductor device according to a third embodiment of the present invention. The same members as the members described earlier in the first and second embodiments are assigned the same reference characters and descriptions thereof will be omitted. Thus, only points that differ from the semiconductor devices according to the above-described first and second embodiments shall be described. In a semiconductor device 52 according to the present third embodiment, a semiconductor element 19 and a semiconductor element 21 are laminated. The semiconductor element 19 adhered onto a die pattern 3 includes a plurality of connecting terminals 20 formed at the center of the principal front face thereof, and the semiconductor element 21 whose projected area is smaller than the semiconductor element 19 is connected on top of the semiconductor element 19 via bumps 22 using a flip-chip method.

The bumps 22 may be either bumps formed from, for example, one of a zinc alloy, a tin alloy, a bismuth alloy and a silver alloy, or bumps in which a solder layer is formed on an upper layer or the entire front face of a core formed by electrolytic/nonelectrolytic plating and made up of one of copper and nickel.

With this semiconductor device 52 also, since projected electrodes 9 similar to the projected electrodes of the first embodiment described earlier are provided, a stable junction can be obtained when configuring a PoP semiconductor apparatus with a three-dimensional mounting structure and higher reliability can be achieved. Meanwhile, with this semiconductor device 52, in comparison with the semiconductor devices according to the first embodiment described earlier, three-dimensional densification is achieved due to lamination of a plurality of semiconductor devices. As a result, a PoP semiconductor apparatus with a higher density can be achieved.

Fourth Embodiment

Figure 15:
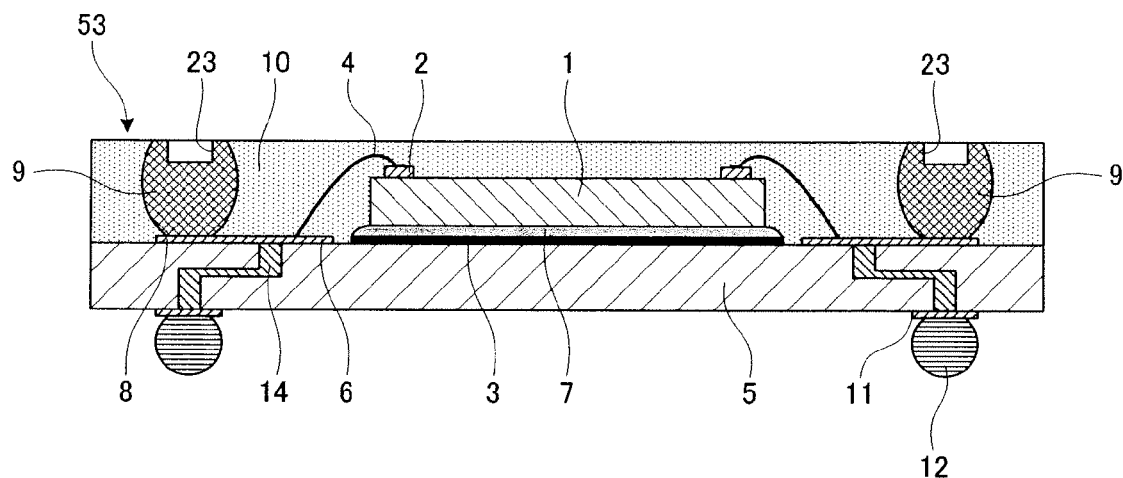
FIG. 15 is a cross-sectional view showing the configuration of a semiconductor device according to a fourth embodiment of the present invention.

FIG. 15 is a cross-sectional view showing the configuration of a semiconductor device according to a fourth embodiment of the present invention. However, the same members as the members described earlier in the first to third embodiments are assigned the same reference characters and descriptions thereof will be omitted. Thus, only points that differ from the semiconductor devices according to the above-described first to third embodiments shall be described. In a semiconductor device 53 according to the present fourth embodiment, the distal end faces of projected electrodes 9 are exposed from an upper face of a molding resin portion 10, and depressed portions 23 are formed on the distal end faces.

A method of manufacturing the semiconductor device 53 will now be described with reference to FIGS. 16 to 19. However, detailed descriptions of the same steps as the manufacturing method described earlier in the first embodiment will be omitted. Hereinafter, a MAP method will be described in which a plurality of semiconductor devices are simultaneously molded with resin.

Figure 16:
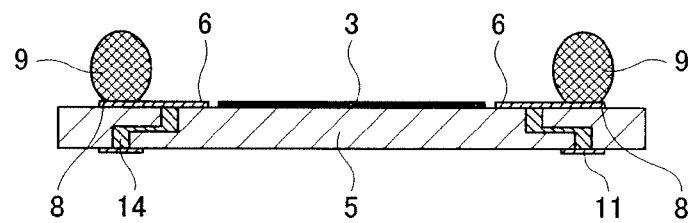
FIG. 16 is a process cross-sectional view for describing a process of manufacturing the semiconductor device according to the fourth embodiment of the present invention.

First, as shown in FIG. 16, ball-shaped projected electrodes 9 are joined to a plurality of laminated lands 8 on a substrate 5.

Figure 17:
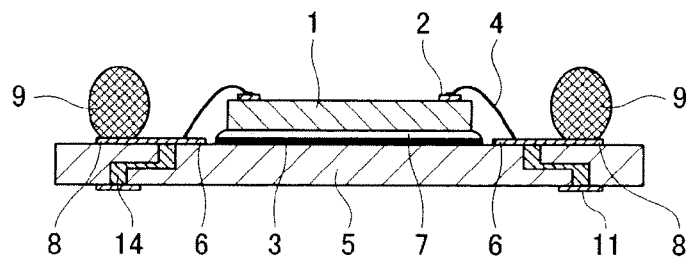
FIG. 17 is a process cross-sectional view for describing a process of manufacturing the semiconductor device according to the fourth embodiment of the present invention.

Next, as shown in FIG. 17, a semiconductor element 1 is bonded onto a die pattern 3 of the substrate 5. Subsequently, electrode terminals 2 on the semiconductor element 1 and corresponding connecting terminals 6 on the substrate 5 are connected together with thin metallic wires 4 using a wire bonding method. The loop height of the thin metallic wires 4 is set lower than the height of the bottom face of the depressed portions 23 formed on the distal end faces of the projected electrodes 9.

Instead of electrically connecting the semiconductor element to the substrate with thin metallic wires using a wire bonding method, the semiconductor element may be electrically connected to the substrate using a flip-chip method in which bumps formed on the principal face of the semiconductor element and connection terminals formed in an element mounting region of the substrate are connected to each other. In this case, the height of the bottom faces of the depressed portions 23 formed on the distal end faces of the projected electrodes 9 is favorably set higher than the height of an upper face of the semiconductor element.

Figure 18:
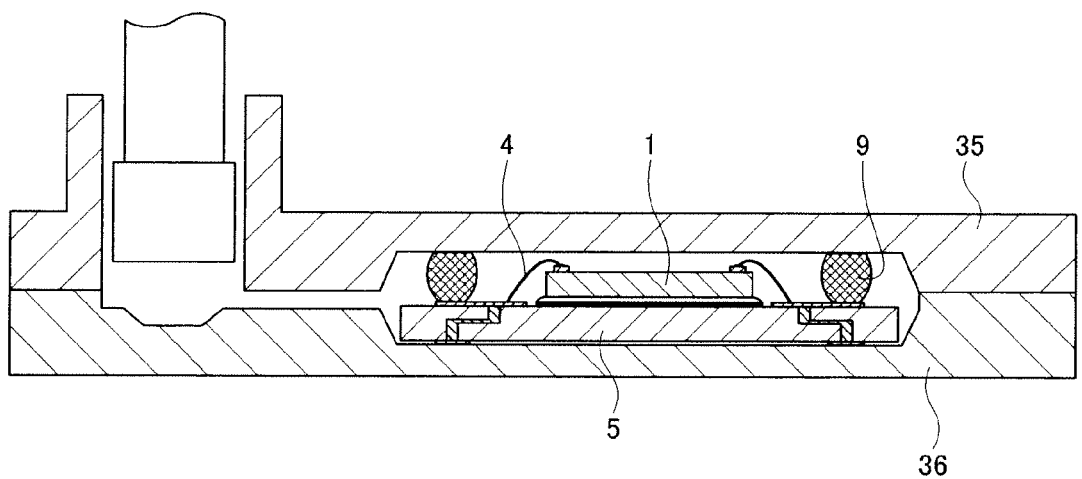
FIG. 18 is a process cross-sectional view for describing a process of manufacturing the semiconductor device according to the fourth embodiment of the present invention.

Next, as shown in FIG. 18, the substrate 5 is clamped by an upper mold 35 and a lower mold 36 of a transfer molding mold. A molding face (inner face) of the upper mold 35 is set lower than the projected electrodes 9, and the pressing force during clamping presses ends of the projected electrodes 9 against the flat molding face of the upper mold 35, thereby flattening the distal end faces of the projected electrodes 9 against the upper face of the molding resin portion 10.

Subsequently, a liquid molding resin material is injected into a cavity of the transfer molding mold. The injected molding resin material is thermally cured to form the molding resin portion 10. The mold is opened when thermal curing is completed and a molded body in which the entire front face of the substrate is molded with resin is extracted.

Moreover, it is favorable that either the temperature at which the molding resin portion 10 is formed is set to a temperature lower than the melting point of the projected electrodes 9 or the projected electrodes 9 are formed by a material having a melting point that is higher than the temperature at which the molding resin portion 10 is formed.

Figure 19:
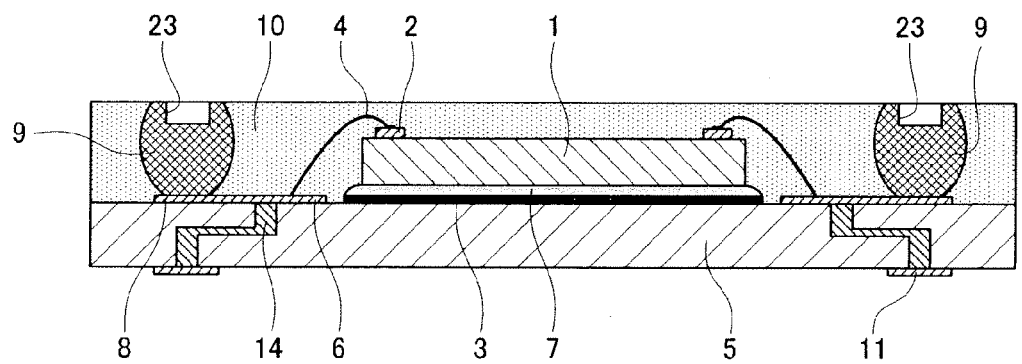
FIG. 19 is a process cross-sectional view for describing a process of manufacturing the semiconductor device according to the fourth embodiment of the present invention.

Next, as shown in FIG. 19, the depressed portions 23 are formed on the flattened distal end faces (portions pressed against the molding face of the upper mold 35) of the projected electrodes 9 exposed from the upper face of the molding resin portion 10. The depressed portions 23 may be formed using any one processing method of punching, press working, cutting, and laser working. The depressed portions 23 may either be formed so as to open a partial region of the distal end faces of the projected electrodes 9 exposed from the upper face of the molding resin portion 10 or be formed so as to open the entire distal end faces. Subsequently, rear-face projected electrodes 12 are formed on rear-face lands 11 of the substrate 5 and then separated.

While the case of manufacturing a BGA semiconductor device has been described, it is obvious that the manufacturing method can also be applied to the manufacturing of an LGA (Land Grid Array) semiconductor device. In addition, while a MAP method in which a plurality of semiconductor devices is simultaneously molded with resin has been described, the method may also be applied to a single molding method in which semiconductor devices are individually molded.

Furthermore, while the case of transfer-molding the molding resin portion has been described, the molding resin portion may be compression-molded instead. In the case of performing compression molding, the pressing force during compression molding should press the ends of the projected electrodes against the molding face of the mold.

Figure 20:
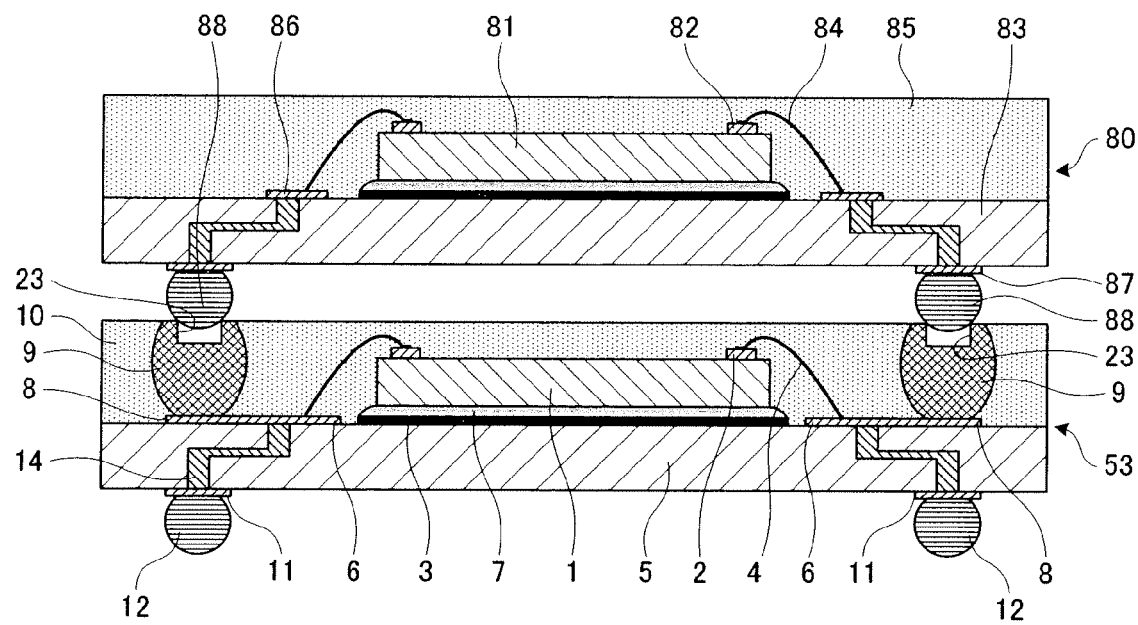
FIG. 20 is a process cross-sectional view for describing a process of mounting another semiconductor device on an upper side of the semiconductor device according to the fourth embodiment of the present invention.

FIG. 20 is a process cross-sectional diagram showing a process in which a BGA semiconductor device 80 is mounted on top of the semiconductor device 53 obtained by the manufacturing method described above. As shown in FIG. 20, when mounting the BGA semiconductor device 80 that is an upper-level semiconductor device on top of the semiconductor device 53 that is a lower-level semiconductor device, since rear-face projected electrodes 88 of the BGA semiconductor device 80 can be lowered into the depressed portions 23 to enable positional regulation, horizontal variations can be suppressed. As described above, by using the semiconductor device 53 as a lower-level semiconductor device when configuring a PoP semiconductor apparatus with a three-dimensional mounting structure, variations in the two-dimensional positional relationship between the upper-level semiconductor device and the lower-level semiconductor device can be suppressed. As a result, the upper-level semiconductor device can be joined in a stable manner and junction reliability can be enhanced. A PoP semiconductor apparatus can now be prepared in an easier and less expensive manner. In addition, by varying the sizes (depth and/or width) of the depressed portions, the mounting height of another semiconductor device to be stacked on an upper level can be varied.

Moreover, instead of forming the depressed portions 23 on the distal end faces of the projected electrodes 9 exposed from the upper face of the molding resin portion 10, depressed portions may be formed on the upper face of the molding resin portion 10, whereby the distal ends of the projected electrodes are exposed from the depressed portions. In addition, depressed portions may further be formed on the distal ends of the projected electrodes exposed from the depressed portions of the molding resin portion. Furthermore, the molding resin portion may be formed without pressing the ends of the projected electrodes against the inner face of the mold, whereby depressed portions are formed on the upper face of the molding resin portion and the distal ends of the projected electrodes are exposed from the depressed portions.

Fifth Embodiment

Figure 21:
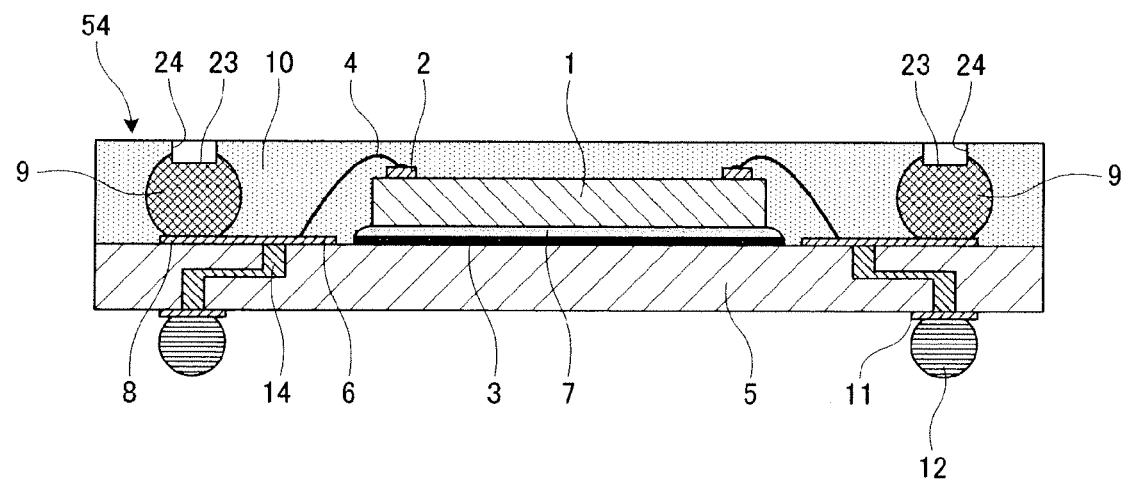
FIG. 21 is a cross-sectional view showing the configuration of a semiconductor device according to a fifth embodiment of the present invention.

FIG. 21 is a cross-sectional view showing the configuration of a semiconductor device according to a fifth embodiment of the present invention. However, the same members as the members described earlier in the first to fourth embodiments are assigned the same reference characters and descriptions thereof will be omitted. Thus, only points that differ from the semiconductor devices according to the above-described first to fourth embodiments shall be described. In a semiconductor device 54 according to the present fifth embodiment, depressed portions 24 are formed on an upper face of a molding resin portion 10, and the distal ends of projected electrodes 9 on which depressed portions 23 are formed are exposed from the depressed portions 24 of the molding resin portion 10.

Figure 22:
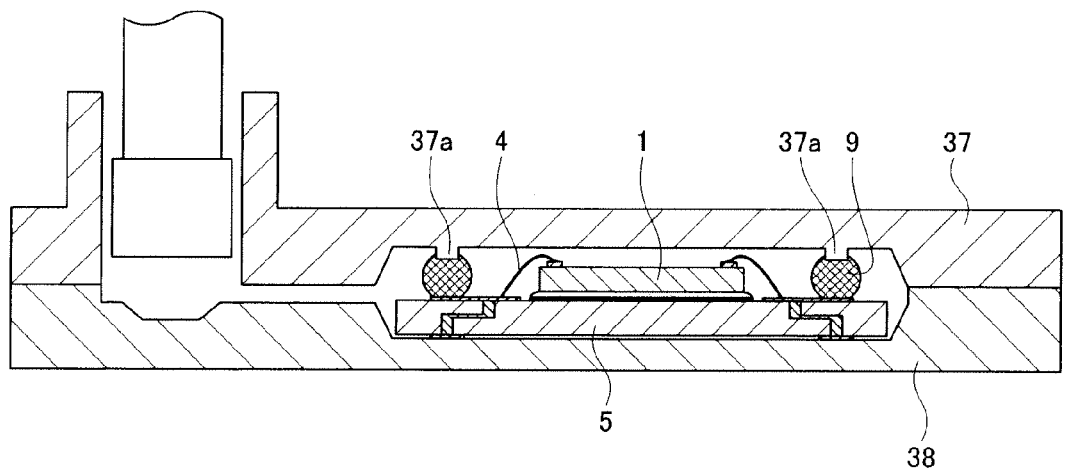
FIG. 22 is a process cross-sectional view for describing a resin molding process among processes of manufacturing the semiconductor device according to the fifth embodiment of the present invention.

A method of manufacturing the semiconductor device 54 will now be described. However, descriptions of the same steps as the manufacturing method described earlier in the fourth embodiment will be omitted. FIG. 22 shows a state where a substrate 5 in which the projected electrodes 9 and a semiconductor element 1 are joined together on the front face of the substrate is clamped by an upper mold 37 and a lower mold 38 of a transfer molding mold.

As shown in FIG. 22, convex portions 37a having flat distal end faces whose diameters are smaller than the projected electrodes 9 are provided on a molding face (inner face) of the upper mold 37.

When clamping the substrate 5 with the transfer molding mold, the pressing force during clamping presses the ends of the projected electrodes 9 against the convex portions 37a. As a result, the depressed portions 23 are formed on the distal ends of the projected electrodes 9. In the present fifth embodiment, the molding face of the upper mold 37 is higher than the projected electrodes 9.

In such a state, a liquid molding resin material is injected into a cavity of the transfer molding mold. As the injected molding resin material is thermally cured to form the molding resin portion 10, the depressed portions 24 are formed on the upper face of the molding resin portion 10, whereby the depressed portions 23 formed on the distal ends of the projected electrodes 9 are exposed from the depressed portions 24 of the molding resin portion 10.

While the case of transfer-molding the molding resin portion was described, the molding resin portion may be compression-molded instead. In the case of performing compression molding, the pressing force during compression molding should press the ends of the projected electrodes against the convex portions formed on the molding face.

Figure 23:
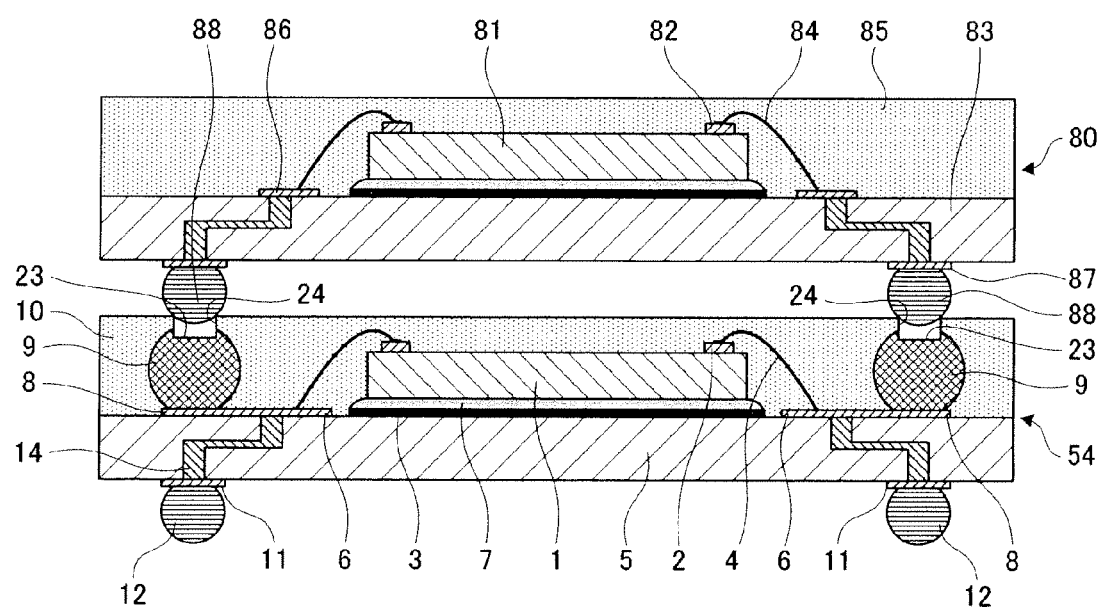
FIG. 23 is a process cross-sectional view for describing a process of mounting another semiconductor device on an upper side of the semiconductor device according to the fifth embodiment of the present invention.

FIG. 23 is a process cross-sectional diagram showing a process in which a BGA semiconductor device 80 is mounted on top of the semiconductor device 54 obtained by the manufacturing method described above. As shown in FIG. 23, when mounting the BGA semiconductor device 80 that is an upper-level semiconductor device on top of the semiconductor device 54 that is a lower-level semiconductor device, since rear-face projected electrodes 88 of the BGA semiconductor device 80 can be lowered into the depressed portions 24 of the molding resin portion 10 to enable positional regulation, horizontal variations can be suppressed. In addition, by varying the sizes (depth and/or width) of the depressed portions 23 of the projected electrodes 9 and the depressed portions 24 of the molding resin portion 10, the mounting height of another semiconductor device to be stacked on an upper level can be varied. Furthermore, by providing the depressed portions 24 at the molding resin portion 10, solder shorts with adjacent ball electrodes can be prevented.

Figure 24:
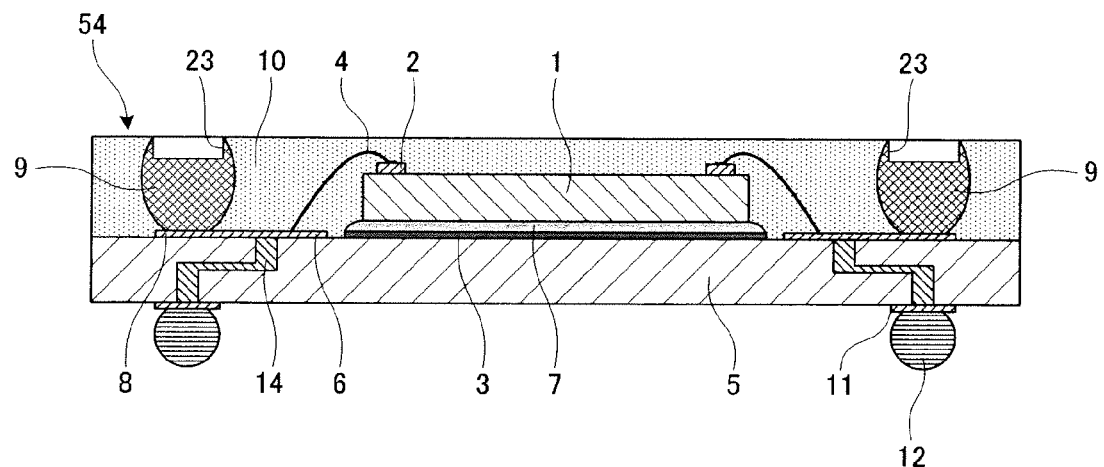
FIG. 24 is a cross-sectional view showing the configuration of another semiconductor device according to the fifth embodiment of the present invention.

Moreover, the height of the molding face of the upper mold 37 may be set either the same as or lower than the height of the projected electrodes 9. When the height of the molding face of the upper mold 37 is lower than the height of the projected electrodes 9, the ends of the projected electrodes 9 are pressed against the convex portions 37a and portions of the molding face peripheral to the convex portions 37a. A semiconductor device obtained in this case is shown in FIG. 24.

Furthermore, the shape of the convex portions 37a provided on the molding face of the upper mold 37 may be one of a conical shape, a hemispherical shape, a tapered staircase shape and the like which enables one of a tapered shape, an arc shape and a multilevel shape to be formed on at least a part of the internal walls of the depressed portions 23 of the projected electrodes 9 and the depressed portions 24 of the molding resin portion 10. Consequently, mold separability upon opening the mold can be improved.

Sixth Embodiment

Figure 25:
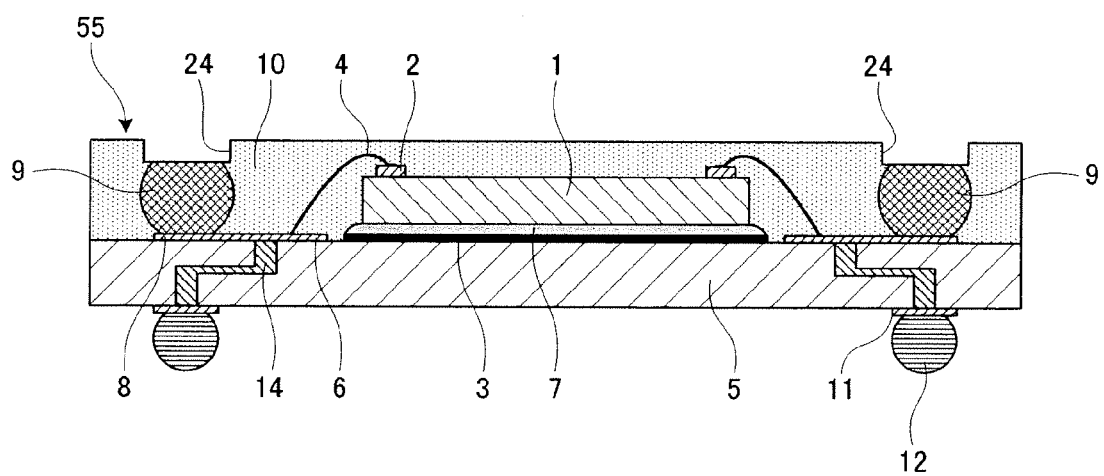
FIG. 25 is a cross-sectional view showing the configuration of a semiconductor device according to a sixth embodiment of the present invention.

FIG. 25 is a cross-sectional view showing the configuration of a semiconductor device according to a sixth embodiment of the present invention. However, the same members as the members described earlier in the first to fifth embodiments are assigned the same reference characters and descriptions thereof will be omitted. Thus, only points that differ from the semiconductor devices according to the above-described first to fifth embodiments shall be described. In a semiconductor device 55 according to the present sixth embodiment, depressed portions 24 are formed on an upper face of a molding resin portion 10, and flat distal ends of projected electrodes 9 are exposed from bottom faces of the depressed portions 24 of the molding resin portion 10.

Figure 26:
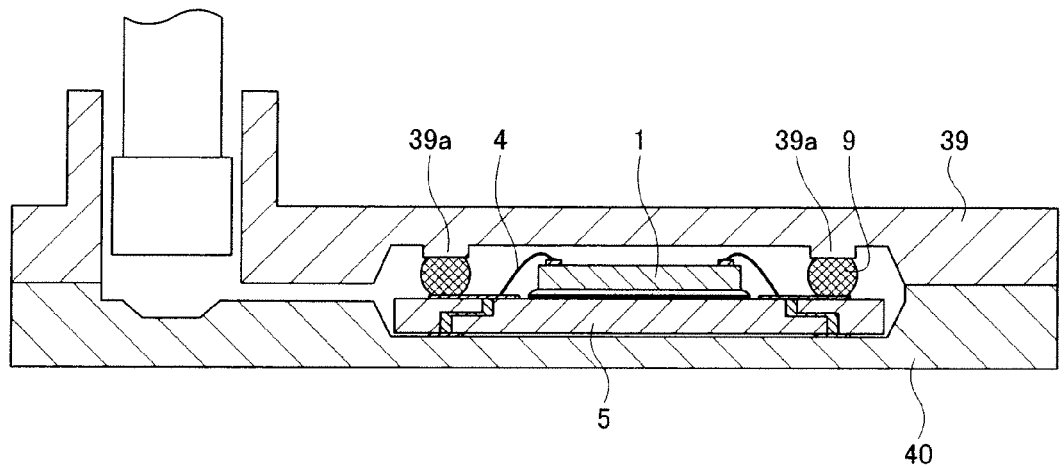
FIG. 26 is a process cross-sectional view for describing a resin molding process among processes of manufacturing the semiconductor device according to the sixth embodiment of the present invention.

A method of manufacturing the semiconductor device 55 will now be described. However, descriptions of the same steps as the manufacturing method described earlier in the fourth embodiment will be omitted. FIG. 26 shows a state where a substrate 5 in which the projected electrodes 9 and a semiconductor element 1 are joined on the front face of the substrate is clamped by an upper mold 39 and a lower mold 40 of a transfer molding mold.

As shown in FIG. 26, cylindrical convex portions 39a having flat distal end faces whose diameters are greater than the projected electrodes 9 are provided on a molding face (inner face) of the upper mold 39.

When clamping the substrate 5 with the transfer molding mold, the pressing force during clamping presses the ends of the projected electrodes 9 against the distal end faces of the convex portions 39a, thereby flattening the distal end faces of the projected electrodes 9.

In such a state, a liquid molding resin material is injected into a cavity of the transfer molding mold. As the injected molding resin material is thermally cured to form the molding resin portion 10, the depressed portions 24 are formed on the upper face of the molding resin portion 10 and the flat distal end faces of the projected electrodes 9 are exposed from the bottom faces of the depressed portions 24 of the molding resin portion 10.

While the case of transfer-molding the molding resin portion has been described, the molding resin portion may be compression-molded instead. In the case of performing compression molding, the pressing force during compression molding presses the ends of the projected electrodes against the distal end faces of the convex portions formed on the molding face.

Figure 27:
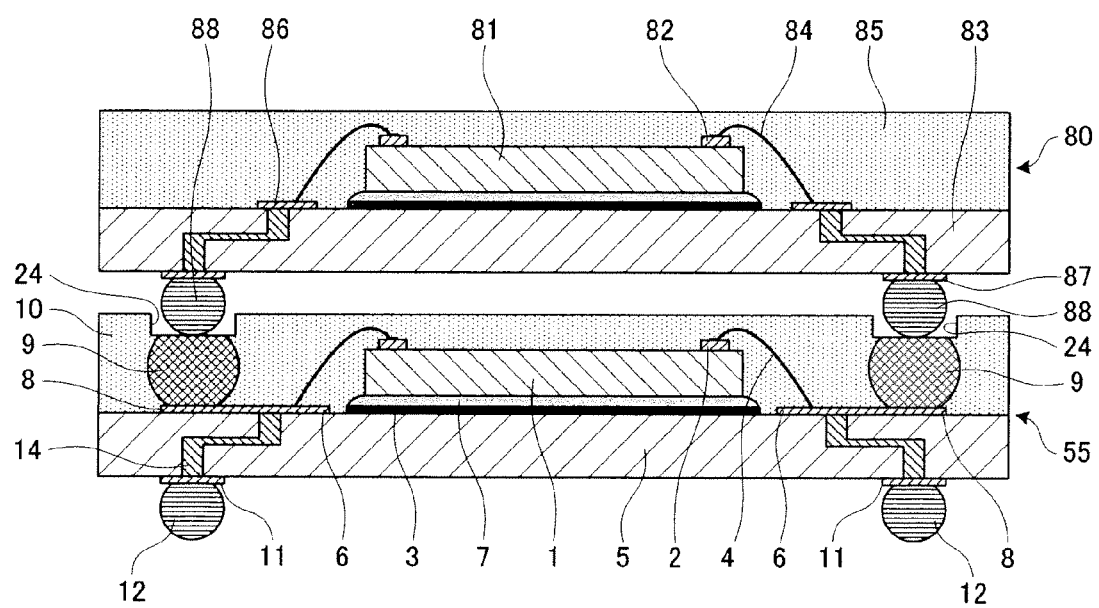
FIG. 27 is a process cross-sectional view for describing a process of mounting another semiconductor device on an upper side of the semiconductor device according to the sixth embodiment of the present invention.

FIG. 27 is a process cross-sectional diagram showing a process in which a BGA semiconductor device 80 is mounted on top of the semiconductor device 55 obtained by the manufacturing method described above. As shown in FIG. 27, when mounting the BGA semiconductor device 80 that is an upper-level semiconductor device on top of the semiconductor device 55 that is a lower-level semiconductor device, since rear-face projected electrodes 88 of the BGA semiconductor device 80 can be lowered into the depressed portions 24 of the molding resin portion 10 to enable positional regulation, horizontal variations can be suppressed. In addition, by varying the sizes (depth and/or width) of the depressed portions 24 of the molding resin portion 10, the mounting height of another semiconductor device to be stacked on an upper level can be varied. Furthermore, by providing the depressed portions 24 at the molding resin portions 10, solder shorts with adjacent ball electrodes can be prevented.

Moreover, the shape of the convex portions 39a provided on the molding face of the upper mold 39 may be one of a conical shape, a hemispherical shape, a tapered staircase shape and the like which enables one of a tapered shape, an arc shape and a multilevel shape to be formed on at least a part of the internal walls of the depressed portions 24 of the molding resin portion 10. Consequently, mold separability upon opening the mold can be improved.

Seventh Embodiment

Figure 28:
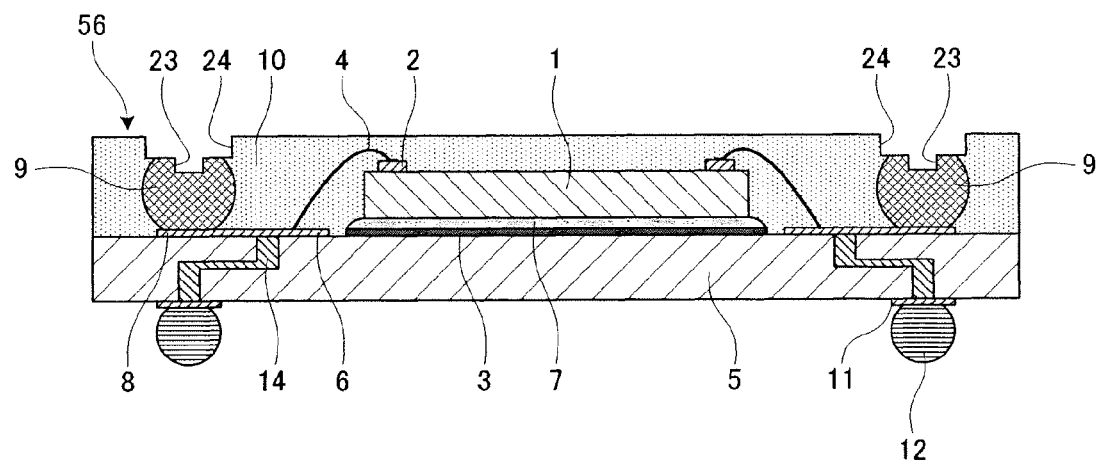
FIG. 28 is a cross-sectional view showing the configuration of a semiconductor device according to a seventh embodiment of the present invention.

FIG. 28 is a cross-sectional view showing the configuration of a semiconductor device according to a seventh embodiment of the present invention. However, the same members as the members described earlier in the first to sixth embodiments are assigned the same reference characters and descriptions thereof will be omitted. Thus, only points that differ from the semiconductor devices according to the above-described first to sixth embodiments shall be described. In a semiconductor device 56 according to the present seventh embodiment, depressed portions 24 are formed on an upper face of a molding resin portion 10, and the distal ends of projected electrodes 9 on which depressed portions 23 are formed are exposed from bottom faces of the depressed portions 24 of the molding resin portion 10.

Figure 29:
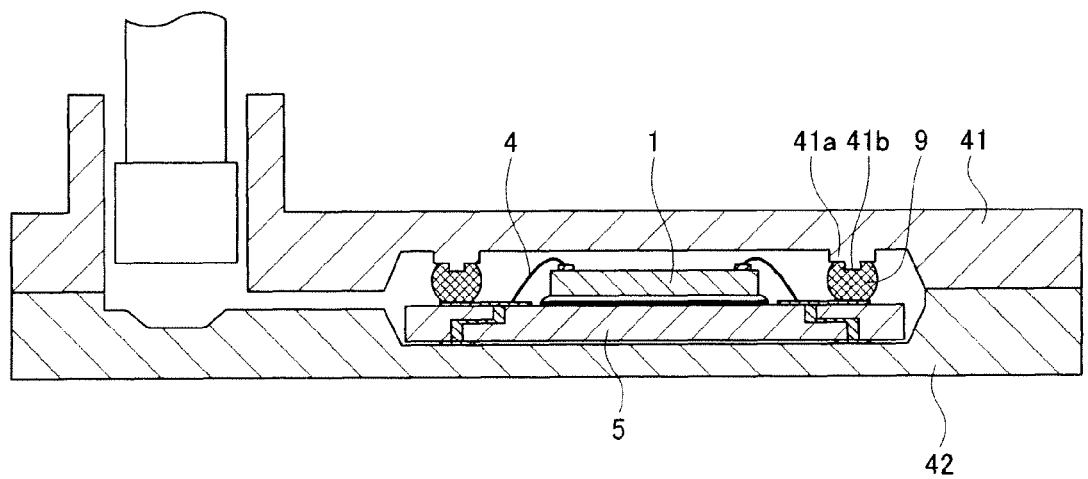
FIG. 29 is a process cross-sectional view for describing a resin molding process among processes of manufacturing the semiconductor device according to the seventh embodiment of the present invention.

A method of manufacturing the semiconductor device 56 will now be described. However, descriptions of the same steps as the manufacturing method described earlier in the fourth embodiment will be omitted. FIG. 29 shows a state where a substrate 5 in which the projected electrodes 9 and a semiconductor element 1 are joined on the front face of the substrate is clamped by an upper mold 41 and a lower mold 42 of a transfer molding mold.

As shown in FIG. 29, a molding face (inner face) of the upper mold 41 is provided with convex portions respectively including: a cylindrical large diameter portion 41*a* whose distal end face is flat and greater in diameter than the projected electrode 9; and a cylindrical small diameter portion 41*b* (small-diameter convex portion) provided on the distal end face of the large diameter portion 41*a* and whose distal end face is flat and smaller in diameter than the projected electrode 9.

When clamping the substrate 5 with the transfer molding mold, the pressing force during clamping presses the ends of the projected electrodes 9 against the small diameter portions 41*b* and the distal end faces of the large diameter portions 41*a*, thereby flattening the distal end faces of the projected electrodes 9 and forming the depressed portions 23 on the distal end faces of the projected electrodes 9.

In such a state, a liquid molding resin material is injected into a cavity of the transfer molding mold. As the injected molding resin material is thermally cured to form the molding resin portion 10, the large diameter portions 41*a* cause the depressed portions 24 to be formed on the upper face of the molding resin portion 10 while the small diameter portions 41*b* cause the depressed portions 23 to be formed on the distal end faces of the projected electrodes 9 exposed from the depressed portions 24 of the molding resin portion 10.

While the case of transfer-molding the molding resin portion was described, the molding resin portion may be compression-molded instead. In the case of performing compression molding, the pressing force during compression molding presses the ends of the projected electrodes against the convex portions formed on the molding face.

Figure 30:
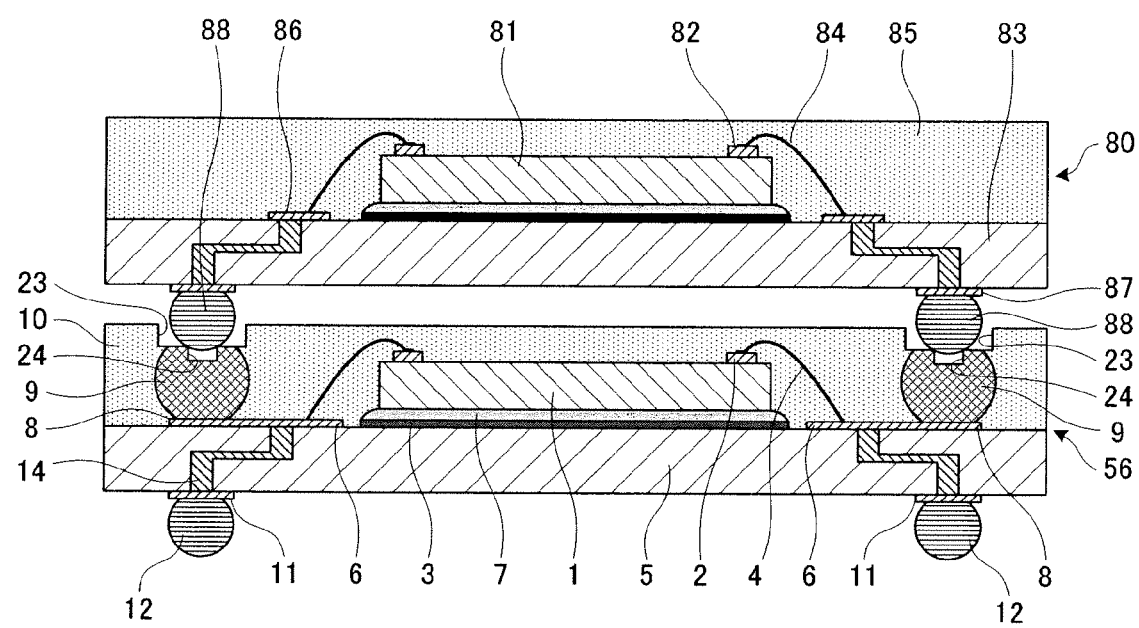
FIG. 30 is a process cross-sectional view for describing a process of mounting another semiconductor device on an upper side of the semiconductor device according to the seventh embodiment of the present invention.
Figure 31:
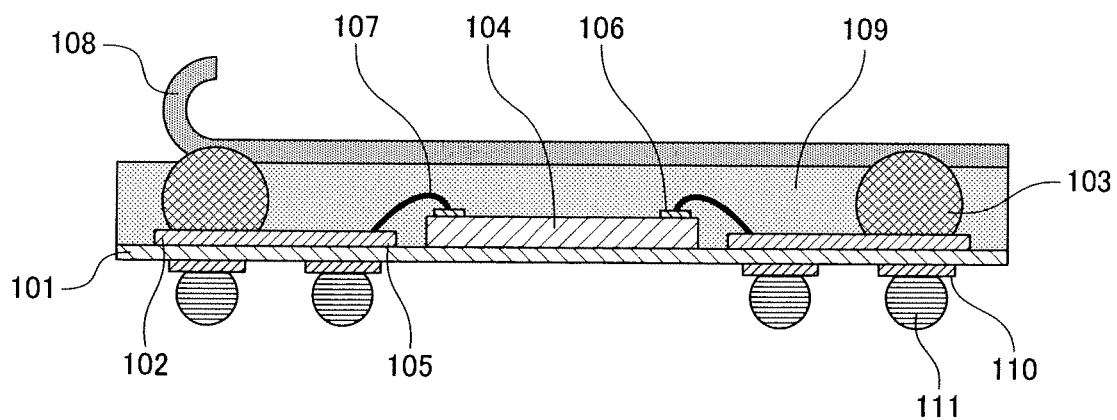
FIG. 31 is a process cross-sectional view for describing a process of manufacturing a conventional semiconductor device.
Figure 32:
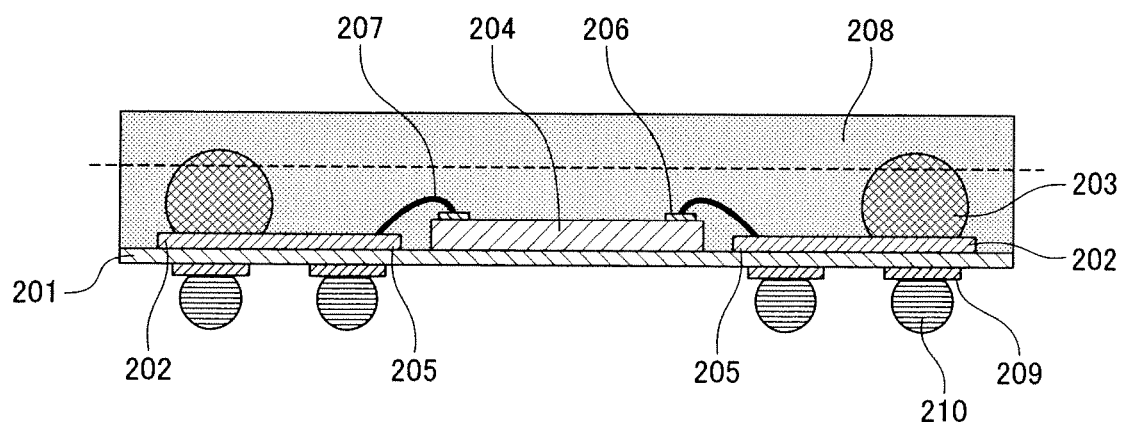
FIG. 32 is a process cross-sectional view for describing a process of manufacturing another conventional semiconductor device.

FIG. 30 is a process cross-sectional diagram showing a process in which a BGA semiconductor device 80 is mounted on top of the semiconductor device 56 obtained by the manufacturing method described above. As shown in FIG. 30, when mounting the BGA semiconductor device 80 that is an upper-level semiconductor device on top of the semiconductor device 56 that is a lower-level semiconductor device, since rear-face projected electrodes 88 of the BGA semiconductor device 80 can be lowered into the depressed portions 23 of the projected electrodes 9 to enable positional regulation, horizontal variations can be suppressed. In addition, by varying the sizes (depth and/or width) of the depressed portions 23 of the projected electrodes 9 and the depressed portions 24 of the molding resin portion 10, the mounting height of another semiconductor device to be stacked on an upper level can be varied. Furthermore, by providing the depressed portions 24 at the molding resin portions 10, solder shorts with adjacent ball electrodes can be prevented.

Moreover, the shapes of the large diameter portions 41*a* and the small diameter portions 41*b* of the convex portions provided on the molding face of the upper mold 41 may be one of a conical shape, a hemispherical shape, a tapered staircase shape and the like which enables one of a tapered shape, an arc shape and a multilevel shape to be formed on at least a part of the internal walls of the depressed portions 23 of the projected electrodes 9 and the depressed portions 24 of the molding resin portion 10. Consequently, mold separability upon opening the mold can be improved.

What is claimed is:

1. A semiconductor device comprising:
    a substrate having a first surface and a second surface opposed to the first surface;
    a semiconductor element mounted on the first surface of the substrate;
    a molding resin on the first surface of the substrate;
    first electrodes on the first surface of the substrate, the first electrode in a region outside of the semiconductor element; and
    second electrodes under the second surface of the substrate,
    wherein the semiconductor element has an upper surface and a side surface, the upper surface and the side surface of the semiconductor element being directly in contact with the molding resin,
    the molding resin has a first depression corresponding to at least one of the first electrodes,
    at least one of the first electrodes has an upper portion and a side portion, the upper portion of the first electrode exposed from the molding resin and at least a portion of the side portion of the first electrode being directly in contact with the molding resin, and
    there is a second depression in the upper portion of the first electrode.

2. The semiconductor device according to claim 1, wherein at least one of the first electrodes is circular in plan view.

3. The semiconductor device according to claim 1, wherein the first electrodes are made of solder.

4. The semiconductor device according to claim 1, wherein the first electrode has a first portion which is the widest portion of the first electrode,
    the second electrode has a second portion which is the widest portion of the second electrode, and
    the first portion of the first electrode is wider than the second portion of the second electrode.

5. The semiconductor device according to claim 1, wherein the second electrode is directly under the first electrode.

6. The semiconductor device according to claim 1, wherein the second electrodes surround the semiconductor element in plan view.

7. The semiconductor device according to claim 1, wherein the first electrodes surround the semiconductor element.

8. The semiconductor device according to claim 1, wherein at least one of the first electrodes has a first region, a second region and a third region in cross-sectional view, the second region being between the first region and the third region, the first region being inside a periphery of the second region in plan view, and the third region being inside the periphery of the second region in plan view.

9. The semiconductor device according to claim 1, further comprising:
    an electrode terminal on the upper surface of the semiconductor element; and
    a thin metallic wire connected to the electrode terminal of the semiconductor element,
    wherein the semiconductor element has a lower surface connected to the first surface of the substrate by an adhesive.

10. The semiconductor device according to claim 1, further comprising another semiconductor element mounted on the upper surface of the semiconductor element, the other semiconductor element having an upper surface and a side surface, the upper surface and the side surface of the other semiconductor element being directly in contact with the molding resin.

11. The semiconductor device according to claim 10, wherein the other semiconductor element has a lower surface which is connected to the upper surface of the semiconductor element by a bump.

12. The semiconductor device according to claim 1, wherein the semiconductor element has a lower surface connected to the first surface of the substrate by a bump.

13. The semiconductor device according to claim 1, wherein at least one of the first electrodes has a portion which is exposed from the molding resin, the portion being lower than an upper surface of the molding resin.

14. A semiconductor apparatus comprising:
the semiconductor device according to claim 1; and
an other semiconductor device, the other semiconductor device comprising:
- an other substrate having a third surface, and a fourth surface opposed to the third surface;
- an other semiconductor element mounted on the third surface of the other substrate; and
- third electrodes under the fourth surface of the other substrate,
- wherein the third electrode of the other semiconductor device is connected to the upper portion of the first electrode of the semiconductor device at a connecting portion, the connecting portion being lower than an upper surface of the molding resin of the semiconductor device, and
- the lowest portion of at least one of the third electrodes of the other semiconductor device is in the second depression of the first electrode of the semiconductor device.

15. The semiconductor apparatus according to claim 14, wherein the height of the upper surface of the molding resin of the semiconductor device is substantially uniform, except for the connecting portion.

16. The semiconductor device according to claim 1, wherein the first depression of the molding resin is at the upper portion of the first electrode.

17. The semiconductor device according to claim 1, wherein the second depression of the first electrode is in contact with the first depression of the molding resin.

18. The semiconductor device according to claim 1, wherein a width of the second depression is shorter than a width of the first depression.

19. The semiconductor device according to claim 1, wherein a height of at least one of the first electrodes is higher than a height of at least one of the second electrodes.

* * * * *